US007816936B2

(12) United States Patent
Ito

(10) Patent No.: US 7,816,936 B2
(45) Date of Patent: Oct. 19, 2010

(54) APPARATUS FOR CONTROLLING SUBSTRATE VOLTAGE OF SEMICONDUCTOR DEVICE

(75) Inventor: Minoru Ito, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/721,652

(22) Filed: Mar. 11, 2010

(65) Prior Publication Data

US 2010/0225382 A1 Sep. 9, 2010

Related U.S. Application Data

(62) Division of application No. 11/459,727, filed on Jul. 25, 2006, now Pat. No. 7,714,601.

(30) Foreign Application Priority Data

Jul. 27, 2005 (JP) .............................. 2005/217523

(51) Int. Cl.
*G01R 31/26* (2006.01)
(52) U.S. Cl. ....................... 324/763; 324/765
(58) Field of Classification Search .................. None
See application file for complete search history.

(56) References Cited

U.S. PATENT DOCUMENTS

| | | | |
|---|---|---|---|
| 5,610,550 A | 3/1997 | Furutani | |
| 5,672,995 A | 9/1997 | Hirase et al. | |
| 5,834,967 A | 11/1998 | Kuroda et al. | |
| 6,075,404 A | 6/2000 | Shindoh et al. | |
| 6,097,113 A | 8/2000 | Teraoka et al. | |
| 7,196,571 B2 | 3/2007 | Sumita | |
| 7,405,611 B2 | 7/2008 | Sumita | |
| 7,564,296 B2 | 7/2009 | Ito | |
| 7,714,601 B2 * | 5/2010 | Ito | ............................. 324/763 |

| | | |
|---|---|---|
| 2004/0012397 A1 | 1/2004 | Mizuno et al. |

(Continued)

FOREIGN PATENT DOCUMENTS

JP  60-219560  11/1985

(Continued)

OTHER PUBLICATIONS

Sumita et al., "Mixed Body Bias Techniques With Fixed $V_t$ and $I_{ds}$ Generation Circuits," IEEE Journal of Solid-State Circuits, vol. 40, No. 1, Jan. 2005, pp. 60-66.

*Primary Examiner*—Minh N Tang
(74) *Attorney, Agent, or Firm*—Greenblum & Bernstein P.L.C.

(57) ABSTRACT

A semiconductor integrated circuit apparatus includes an internal circuit having a MIS transistors on a semiconductor substrate and a substrate voltage control block that supplies a substrate voltage to the internal circuit and controls threshold voltages for the MIS transistors of the internal circuit. The apparatus also includes a leakage current detection MIS transistor and a leakage current detection circuit. The substrate voltage control block generates a substrate voltage based on comparison results of the comparator and applies the generated substrate voltage to the substrate of the leakage current detection MIS transistor and the substrate of the MIS transistors of the internal circuit. The substrate voltage control block includes a switch arranged between first and second input terminals of a comparator and a drain of the leakage current detection MIS transistor and a reference potential terminal, as well as an input data corrector that carries out substrate voltage adjustment.

5 Claims, 15 Drawing Sheets

U.S. PATENT DOCUMENTS

| | | |
|---|---|---|
| 2004/0135621 A1 | 7/2004 | Sumita et al. |
| 2005/0146374 A1 | 7/2005 | Sumita |
| 2006/0125550 A1 | 6/2006 | Sumita et al. |
| 2006/0125551 A1 | 6/2006 | Sumita et al. |
| 2006/0186472 A1 | 8/2006 | Ito |
| 2007/0146049 A1 | 6/2007 | Sumita |
| 2008/0290946 A1 | 11/2008 | Sumita |

FOREIGN PATENT DOCUMENTS

| | | |
|---|---|---|
| JP | 6-139779 | 5/1994 |
| JP | 7-183469 | 7/1995 |
| JP | 9-130232 | 5/1997 |
| JP | 10-289580 | 10/1998 |
| JP | 2003-032109 | 1/2003 |
| JP | 2004-165649 | 6/2004 |
| JP | 2005-197411 | 7/2005 |

* cited by examiner

APPARATUS FOR CONTROLLING SUBSTRATE VOLTAGE OF SEMICONDUCTOR DEVICE

CROSS-REFERENCE RELATED TO APPLICATION

This application is a divisional of U.S. application Ser. No. 11/459,727 filed on Jul. 25, 2006 now U.S. Pat. No. 7,714,601, which claims priority to Japanese Application No. 2005-217523, filed Jul. 27, 2005, the disclosure of which is expressly incorporated herein by reference in its entirety.

BACKGROUND OF THE INVENTION

1. Field of the Invention

The present invention relates to a semiconductor integrated circuit apparatus that controls MIS (Metal Insulated Semiconductor) transistor threshold voltage, and particularly relates to a semiconductor integrated circuit apparatus capable of controlling substrate voltage of fine-detailed MIS transistors operating at low power supply voltages.

2. Description of the Related Art

In recent years, methods of lowering power supply voltage are well-known as important methods for making semiconductor integrated circuits low in power consumption. However, by lowering the power supply voltage, fluctuations in threshold voltages of MIS transistors or MOS (Metal Oxide Semiconductor) transistors have a substantial influence on operating speed of semiconductor integrated circuits.

With regards to this problem, in the related art, circuit technology for making variations in threshold voltage small has been developed. For example, as shown in FIG. 12, the following operation is carried out using a leakage current detection circuit where a stabilizing potential generated by two NchMOS transistors $M_{in}$ and $M_{2n}$ operating in a sub-threshold region is applied to a gate of NchMOS transistor $M_{Ln}$ for leakage current detection use and a constant current source is connected to a drain of the transistor $M_{Ln}$, and a substrate bias circuit. First, when the threshold voltage is lower than a target value, leakage current increases to more than a target value and the detected leakage current therefore becomes larger than a set value. As a result, the substrate bias circuit operates, the substrate bias becomes deeper, and the threshold voltage is corrected to be higher. Conversely, when the threshold voltage is higher than a target value, leakage current falls to less than a target value and the detected leakage current therefore becomes smaller than a set value. As a result, the substrate bias circuit makes the substrate bias shallower, and the threshold voltage is corrected to be lower (refer to patent document 1: Japanese Patent Application Laid-Open No. Hei 9-130232).

Further, as shown in FIG. 13, integrated circuit body 16B, monitor section 15B monitoring drain current of at least one of a plurality of NchMOS transistors, and substrate voltage regulating section 14B controlling substrate voltage BN of a semiconductor substrate in such a manner that drain current becomes fixed are provided on the semiconductor substrate. The drain of NchMOS transistor 11B is connected to constant current source 123, the source is connected to earth potential $V_{SS}$ terminal, the gate is set to an arbitrary voltage 17B, and the voltage of reference input IN1 of comparator 13B is set to a power supply voltage value. Input IN2 that is the subject of measurement side of comparator 13B is connected to the drain of the MOS transistor 11B (refer to patent document 2: Japanese Patent Application Laid-Open No. 2004-165649).

Further, in patent document 2, as shown in FIG. 14, integrated circuit body 16A, monitor section 15A monitoring drain current of at least one of a plurality of PchMOS transistors, and substrate voltage regulating section 14A controlling reference voltage BP of a semiconductor substrate are provided on the semiconductor substrate. The monitor section is comprised of a constant current source 12A, and a comparator section 13A comparing source potential of a PchMOS transistor for monitor use and a reference potential determined in advance in a state where a drain of PchMOS transistor 11A for monitor use formed on the same substrate as the plurality of PchMOS transistors and drains of a plurality of PchMOS transistors or NchMOS transistors of the integrated circuit body are connected to a terminal of earth potential $V_{SS}$ terminal. Results of the comparison are then fed-back to the substrate voltage of the PchMOS transistor for monitor use.

Further, as shown in FIG. 15, a monitor section monitoring drain potential of an NchMOS transistor where a gate and drain are connected to a constant current source and a substrate voltage regulating section controlling substrate voltage Vbn of a semiconductor substrate in such a manner that substrate potential becomes constant are provided. The drain of the NchMOS transistor is then connected to one side of the comparator, and the other is connected to reference potential Vgsn (constant potential). Output of the comparator is then inputted to the substrate voltage regulating section and a reference voltage Vbn is generated from the substrate voltage regulating section. Refer, for example, to (Sumita, M. et al., "Mixed Body Bias Techniques With Fixed Vt and Ids Generation Circuits" IEEE JOURNAL OF SOLID-STATE CIRCUITS, VOL. 40, No. 1, JANUARY 2005).

However, semiconductor integrated circuit apparatus of the related art have the following three problems. A first problem is that, in the methods of patent document 1 and patent document 2, as these are both methods for detecting fluctuation of drain potential of a leakage current detection NchMOS transistor, if there is no drain potential fluctuation from an initial potential to a potential exceeding a reference potential for detecting fluctuation of drain potential, it is not possible to detect change in leakage current. This also limits detection sensitivity for leakage current detection and improvement of response.

Further, in a second problem, with the PchMOS transistor substrate voltage control disclosed in patent document 2, restrictions exist in connecting a drain of a PchMOSFET for monitor use and drains of a plurality of PchMOSFETs or NchMOSFETs of an integrated circuit body to an earth potential $V_{SS}$ terminal. This results in the drawback of limitations such as circuit connection limitations being placed on the circuit design.

Further, in a third problem with the method of patent document 2 and patent document 3, because a comparator employing a comparator or operation amplifier is used, a DC offset error of the comparator becomes a threshold voltage setting value error.

SUMMARY OF THE INVENTION

It is therefore an object of the present invention to provide semiconductor integrated circuit apparatus capable of raising detection sensitivity of a leakage current detection circuit and improving response. Further, the present invention provides semiconductor integrated circuit apparatus capable of canceling DC offset error of a comparator and capable of improving precision of controlling substrate voltage.

According to an aspect of the invention, a semiconductor integrated circuit apparatus comprises an internal circuit having a plurality of MIS transistors on a semiconductor substrate, a substrate voltage control block that supplies a substrate voltage to the internal circuit and controls threshold voltages for the MIS transistors of the internal circuit, a leakage current detection MIS transistor supplied with a supply voltage of an arbitrary potential to a drain, that has a source connected to a constant current source, and applied with an arbitrary stabilizing potential to a gate in such a manner that a substrate voltage is controlled by the substrate voltage control block, and a leakage current detection circuit constituted by a comparator comparing source potential of the leakage current detection MIS transistor and a predetermined reference potential. Here, the substrate voltage control block generates a substrate voltage based on comparison results of the comparator and applies the generated substrate voltage to the substrate of the leakage current detection MIS transistor and the substrate of the MIS transistors of the internal circuit.

According to an aspect of the invention, a semiconductor integrated circuit apparatus comprises an internal circuit having a plurality of MIS transistors on a semiconductor substrate, a substrate voltage control block that supplies a substrate voltage to the internal circuit and controls threshold voltages for the MIS transistors of the internal circuit, a leakage current detection NchMIS transistor supplied with a high potential side supply voltage $V_{DD}$ to a drain, that has a source connected to a constant current source, and applied with an arbitrary stabilizing potential to a gate in such a manner that a substrate voltage is controlled by the substrate voltage control block, and a leakage current detection circuit constituted by a comparator comparing source potential of the leakage current detection NchMIS transistor and a predetermined reference potential. The substrate voltage control block generates a substrate voltage based on comparison results of the comparator and applies the generated substrate voltage to the substrate of the leakage current detection NchMIS transistor and the substrate of the NchMIS transistors of the internal circuit.

According to an aspect of the invention, a semiconductor integrated circuit apparatus comprises an internal circuit having a plurality of MIS transistors on a semiconductor substrate, a substrate voltage control block that supplies a substrate voltage to the internal circuit and controls threshold voltages for the MIS transistors of the internal circuit, a leakage current detection PchMIS transistor supplied with a low potential side supply voltage $V_{SS}$ to a drain, that has a source connected to a constant current source, and applied with an arbitrary stabilizing potential to a gate in such a manner that a substrate voltage is controlled by the substrate voltage control block, and a leakage current detection circuit constituted by a comparator comparing source potential of the leakage current detection PchMIS transistor and a predetermined reference potential. The substrate voltage control block generates a substrate voltage based on comparison results of the comparator and applies the generated substrate voltage to the substrate of the leakage current detection PchMIS transistor and the substrate of the PchMIS transistors of the internal circuit, and sources of the plurality of PchMIS transistors of the internal circuit are connected to a high potential side supply voltage $V_{DD}$.

According to an aspect of the invention, a semiconductor integrated circuit apparatus comprises an internal circuit having a plurality of MIS transistors on a semiconductor substrate, a substrate voltage control block that supplies a substrate voltage to the internal circuit and controls threshold voltages for the MIS transistors of the internal circuit, a leakage current detection NchMIS transistor with a low potential side supply voltage $V_{SS}$ supplied to a source and with a gate and drain connected together and connected to a constant current source, with the substrate voltage being controlled by the substrate voltage control block, and a leakage current detection circuit constituted by a comparator comparing drain potential of the leakage current detection NchMIS transistor and a predetermined reference potential. Here, the substrate voltage control block generates a substrate voltage based on comparison results of the comparator and applies the generated substrate voltage to the substrate of the leakage current detection NchMIS transistor and the substrate of the NchMIS transistors of the internal circuit. The substrate voltage control block is comprised of a switch arranged between first and second input terminals of the comparator and the drain of the leakage current detection NchMIS transistor and a reference potential terminal, and an input data correction section that carries out substrate voltage adjustment two times by switching between the drain of the leakage current detection NchMIS transistor and the reference potential terminal and each of the input terminals of the comparator using the switch and takes an average of respective reference voltage setting values when the internal circuit is not operating, and corrects DC offset of the comparator by generating a reference voltage based on the averaged substrate voltage setting value when the internal circuit is operating normally.

According to another aspect of the invention, a semiconductor integrated circuit apparatus comprises an internal circuit having a plurality of MIS transistors on a semiconductor substrate, a substrate voltage control block that supplies a substrate voltage to the internal circuit and controls threshold voltages for the MIS transistors of the internal circuit, a leakage current detection PchMIS transistor with high potential side supply voltage $V_{DD}$ supplied to a source and with a gate and drain connected together and connected to a constant current source, with the substrate voltage being controlled by the substrate voltage control block, and a leakage current detection circuit constituted by a comparator comparing drain potential of the leakage current detection PchMIS transistor and a predetermined reference potential. Here, the substrate voltage control block generates a substrate voltage based on comparison results of the comparator and applies the generated substrate voltage to the substrate of the leakage current detection PchMIS transistor and the substrate of the PchMIS transistors of the internal circuit. The substrate voltage control block comprises a switch arranged between first and second input terminals of the comparator and the drain of the leakage current detection PchMIS transistor and a reference potential terminal, and an input data correction section that carries out substrate voltage adjustment two times by switching between the drain of the leakage current detection PchMIS transistor and the reference potential terminal and each of the input terminals of the comparator using the switch and takes an average of respective reference voltage setting values when the internal circuit is not operating, and corrects DC offset of the comparator by generating a reference voltage based on the averaged substrate voltage setting value when the internal circuit is operating normally.

BRIEF DESCRIPTION OF THE DRAWINGS

The above and other objects and features of the invention will appear more fully hereinafter from a consideration of the following description taken in connection with the accompanying drawings, in which.

DESCRIPTION OF THE PREFERRED EMBODIMENTS

Figure 1:
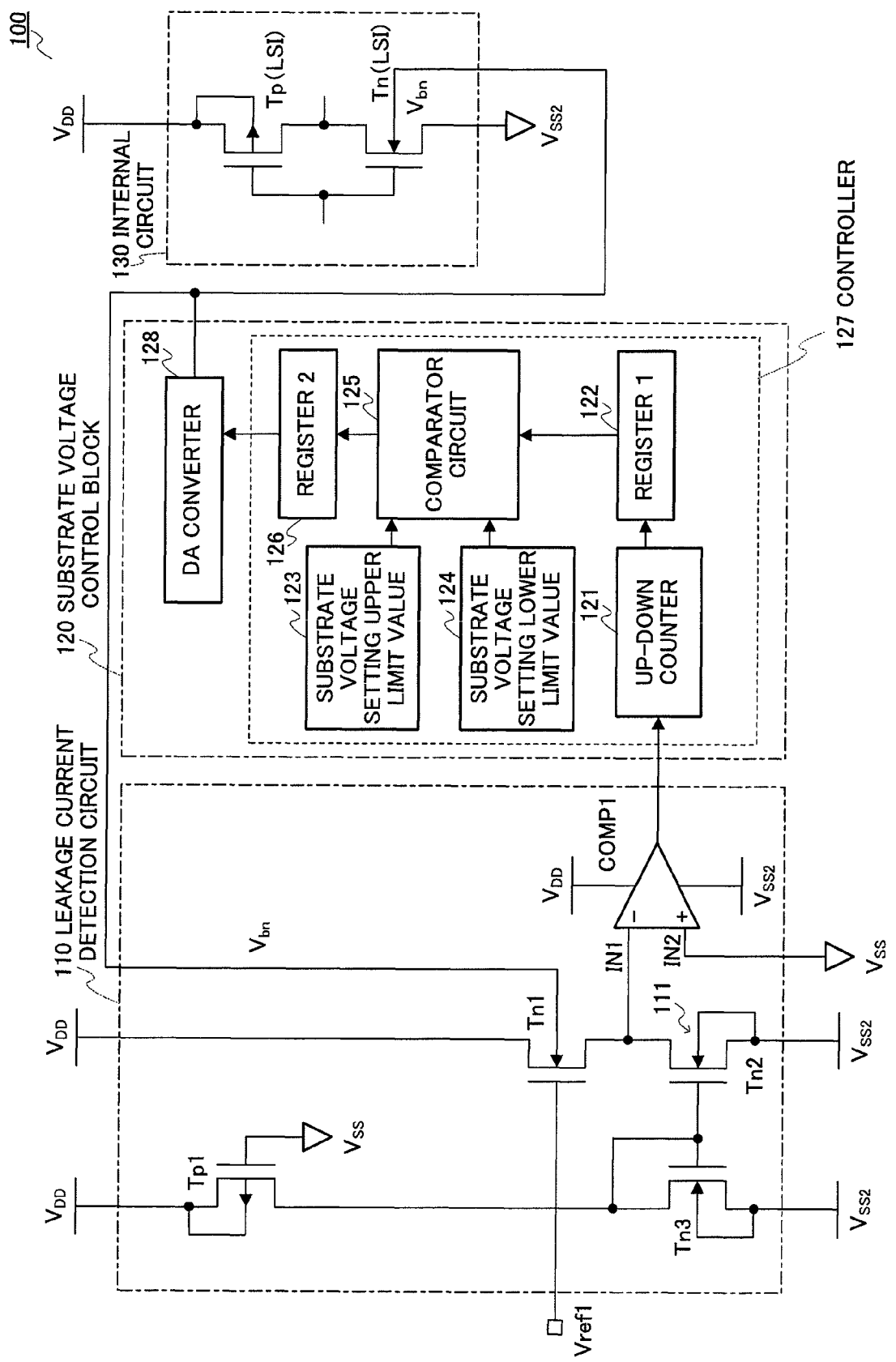
FIG. 1 is a view showing a configuration for a semiconductor integrated circuit apparatus of a first embodiment of the present invention.

The following is a detailed description with reference to the drawings of preferred embodiments of the present invention employing MOS transistors that are typical examples of MIS transistors.

(Description of Theory)

First, a description is given of the basic theory of the present invention.

A semiconductor integrated circuit apparatus controlling MOS transistor threshold voltage of the present invention comprises a leakage current detection circuit, substrate voltage control block, and internal circuit, with the leakage current detection circuit having the following circuit configuration. First, in order to resolve the first problem, a leakage current detection NchMOS transistor $T_{n1}$ is formed, where a high potential side supply voltage $V_{DD}$ is supplied to a drain, a source is connected to a constant current source, and an arbitrary stabilizing potential $V_{ref1}$ is applied to a gate so that a substrate voltage is controlled by a substrate voltage control block. Next, the source of the NchMOS transistor $T_{n1}$ is connected to input terminal IN1 of a comparator employing a comparator or operational amplifier, and low potential side supply voltage $V_{SS}$ is applied to input terminal IN2 of the comparator as a reference potential. At the internal circuit, the $V_{SS}$ terminal is connected to a plurality of NchMOS transistors. An output of the comparator is inputted to the substrate voltage control block, slight changes where the source potential is larger or smaller than $V_{SS}$ are detected, and the substrate voltage of leakage current detection NchMOS transistor $T_{n1}$ and NchMOS transistors of the internal circuit is controlled.

As a result, detection sensitivity and response for the detection potential of the leakage current detection NchMOS transistor $T_{n1}$ are improved.

Further, with substrate voltage control for the PchMOS transistor disclosed on patent document 2, in order to resolve the second problem, a leakage current detection PchMOS transistor $T_{p1}$ where a low potential side supply voltage $V_{SS}$ is supplied to a drain, a source is connected to a constant current source, and an arbitrary stabilizing potential $V_{ref2}$ is applied to a gate so that a substrate voltage is controlled by a substrate voltage control block is formed. Next, the source of PchMOS transistor $T_{p1}$ is connected to input terminal IN1 of the comparator, and $V_{DD}$ is applied to input terminal IN2 of the comparator as a reference potential. The above is substantially the same as the related art example with the difference that in the related art example, the drain of leakage current detection PchMOS transistor $T_{p1}$ and the drains of the plurality of PchMOS transistors or NchMOS transistors of the internal circuit are connected to the $V_{SS}$ terminal, whereas in this embodiment, only the drain of the leakage current detection PchMOS transistor $T_{p1}$ is connected to the $V_{SS}$ terminal, with sources of the plurality of PchMOS transistors being connected to the $V_{DD}$ terminal at the internal circuit.

Further, in order to resolve the third problem, at the semiconductor integrated circuit apparatus controlling NchMOS transistor threshold voltage shown in patent document 2, a switch is provided between the respective input terminals IN1 and IN2 of the comparator and the source and $V_{SS}$ terminal of NchMOS transistor $T_{n1}$. First, when the internal circuit is not operating, the source of NchMOS transistor Tn1 is connected to IN1, $V_{SS}$ terminal is connected to IN2, substrate voltage of the leakage current detection NchMOS transistor is adjusted, and this substrate voltage setting value is inputted to register 1 inside the controller. Next, the switch is switched over, the source of NchMOS transistor $T_{n1}$ is connected to IN2, $V_{SS}$ terminal is connected to IN1, and the substrate voltage of the leakage current detection NchMOS transistor is adjusted. In this event, it is necessary for this to be performed taking into consideration the polarity of the substrate voltage. The substrate voltage setting value obtained in this manner is then inputted to register 2 inside the controller. Next, the average of the respective substrate voltage setting values stored in register 1 and register 2 is taken and stored in register 3, and at the time of normal operation of the internal circuit, the substrate voltage of the internal circuit is controlled to be the substrate voltage setting value of register 3. As a result, it is possible to cancel the DC offset of the comparator and improve the precision with which the substrate voltage is controlled. This can also be similarly applied to substrate voltage control circuits for PchMOS transistors.

Further, with the semiconductor integrated circuit apparatus controlling NchMOS transistor threshold voltage shown in patent document 3, a switch is provided between respective input terminals IN1 and IN2 of the comparator and the drain of NchMOS transistor $T_{n1}$ and reference potential $V_{ref3}$ terminal. First, when the internal circuit is not operating, the drain of NchMOS transistor $T_{n1}$ is connected to IN1, reference potential $V_{ref3}$ terminal is connected to IN2, substrate voltage of the drain voltage detection NchMOS transistor is adjusted, and this substrate voltage setting value is inputted to register 1 inside the controller. Next, the switch is switched over, the drain of NchMOS transistor $T_{n1}$ is connected to IN2, reference potential $V_{ref3}$ terminal is connected to IN1, and the substrate voltage of the drain voltage detection NchMOS transistor is adjusted. In this event, it is necessary for this to be performed taking into consideration the polarity of the substrate voltage. The substrate voltage setting value obtained in this manner is then inputted to register 2 inside the controller. Next, the average of the respective substrate voltage setting values stored in register 1 and register 2 is taken and stored in register 3, and at the time of normal operation of the internal circuit, the substrate voltage of the internal circuit is controlled to be the substrate voltage setting value of register 3. As a result, it is possible to cancel the DC offset of the comparator and improve the precision with which the substrate voltage is controlled. This can also be similarly applied to substrate voltage control circuits for PchMOS transistors.

First Embodiment

FIG. 1 is a view showing a configuration of a semiconductor integrated circuit apparatus of a first embodiment of the present invention based on the aforementioned basic concepts. In this embodiment, an example is given of application to semiconductor integrated circuit apparatus equipped with an NchMOS transistor leakage current detection circuit, substrate voltage control block, and internal circuit.

In FIG. 1, semiconductor integrated circuit apparatus 100 is comprised of NchMOS transistor leakage current detection circuit 110, substrate voltage control block 120 carrying out substrate voltage control, and internal circuit 130 having a plurality of MOS transistors on the semiconductor substrate. Semiconductor integrated circuit apparatus 100 controls the threshold voltage of NchMOS transistors constituting internal circuit 130.

Leakage current detection circuit 110 is comprised of leakage current detection NchMOS transistor $T_{n1}$ with a drain connected to the $V_{DD}$ terminal, a source connected to a constant current source, and an arbitrary stabilizing voltage $V_{ref1}$ applied to a gate so that substrate voltage is controlled by substrate voltage control block 120, comparator COMP1 with a source of NchMOS transistor $T_{n1}$ connected to one input terminal IN1, and $V_{SS}$ applied to the other input terminal IN2 as a reference potential, and constant current source 111 supplying a constant current to leakage current detection NchMOS transistor $T_{n1}$.

Constant current source 111 is comprised of PchMOS transistor $T_{p1}$ with a source connected to the $V_{DD}$ terminal and a gate connected to the $V_{SS}$ terminal, and NchMOS transistor $T_{n2}$ that has a source connected to the $V_{SS2}$ terminal and that constitutes a current mirror circuit together with NchMOS transistor $T_{n3}$ with a gate and drain connected to the drain of $T_{p1}$ and a source connected to the $V_{SS2}$ terminal.

The comparator COMP1 is configured from a comparator and operational amplifier, where if the source potential of leakage current detection NchMOS transistor Tn1 is higher than the reference potential of $V_{SS}$, −1 (a low level) is outputted, and if lower, +1 (a high level) is outputted. The output signal of comparator COMP1 is inputted to up-down counter 121 (described later) inside controller 127, with a down count being performed at the time of −1, and an up count being performed at the time of +1. The count value is then stored in register 1. In a separate method, use of an adder-subtractor is possible.

$V_{SS2}$ that is a voltage lower than $V_{DD}$ and $V_{SS}$ is applied to comparator COMP1 as a power supply voltage. Here, at the internal circuit 130, $V_{SS}$ terminal is connected to a plurality of NchMOS transistors. Output of comparator COMP1 is inputted to substrate voltage control block 120.

Substrate voltage control block 120 may include two types—namely, an analog circuit or a digital circuit—but here, a description is given of an example of a digital circuit. In this example, substrate voltage control block 120 is configured from controller 127 comprised of up-down counter 121, register 122 (register 1), substrate voltage setting upper limit value register 123, substrate voltage setting lower limit value register 124, comparator circuit 125 and register 126 (register 2), and DA converter 128 receiving a digital value from controller 127 and generating a substrate voltage. Controller 127 carries out control in such a manner as to change substrate voltage applied to the substrate of leakage current detection NchMOS transistor $T_{n1}$ and the substrate of the NchMOS transistors of internal circuit 130 by changing a count value of the up-down counter based on the output of comparator COMP1. DA converter 128 DA converts a digital value from controller 127 and generates a substrate voltage.

The substrate voltage generated by DA converter 128 of substrate voltage control block 120 is applied to the substrate of leakage current detection NchMOS transistor $T_{n1}$ of leakage current detection circuit 110 and the substrate of the NchMOS transistors of internal circuit 130.

Internal circuit 130 may be any kind of circuit providing that this is a circuit where threshold voltages of NchMOS transistors of the internal circuit are controlled by semiconductor integrated circuit apparatus 100 but here an example is adopted of a CMOS (Complementary MOS) circuit where gates of a PchMOS transistor and an NchMOS transistor connected in series are common.

Leakage current detection NchMOS transistor $T_{n1}$ may be arranged on the same substrate as the NchMOS transistor of internal circuit 130 or may be arranged on a separate substrate and may be electrically connected.

An upper limit of the output of substrate voltage control block 120 is $V_{SS}$ of internal circuit 130 or more and a lower limit is less than $V_{SS}$ of internal circuit 130. A substrate voltage setting upper limit value and a substrate voltage setting lower limit value are stored in registers 123 and 124 within controller 127 and comparison with the value of register 1 is carried out at comparator circuit 125. In the event that the value of register 1 exceeds the substrate voltage setting upper limit, this substrate voltage setting upper limit value is outputted. In the event that the value of register 1 exceeds the substrate voltage setting lower limit value, this substrate voltage setting lower limit value is outputted, and if the value of register 1 is between the substrate voltage setting lower limit value and the substrate voltage setting upper limit value, the value of register 1 is outputted. The outputted comparison results are then stored in register 2. Namely, the value of register 2 does not exceed the upper limit and lower limit of the substrate voltage setting value.

The value of register 2 from controller 127 is inputted to DA converter 128, and a substrate voltage corresponding to register 2 from DA converter 128 is applied to the substrate of leakage current detection NchMOS transistor $T_{n1}$ and the substrate of the NchMOS transistor of internal circuit 130. Further, it is possible for the output of DA converter 128 to generate a substrate voltage via a buffer (an impedance circuit with an output of the DA converter connected to a +input terminal of an operational amplifier, and with the −input terminal and output terminal of the operational amplifier connected) using, for example, an operational amplifier.

A description is now given of a substrate voltage control operation for semiconductor integrated circuit apparatus 100 of the configuration described above.

First, before starting the substrate voltage control operation, a count value of up-down counter 121 and values of registers 122 and 126 (register 1 and 2) are set to zero (0) or are set to the value measured the previous time. If source potential of leakage current detection NchMOS transistor Tn1 is higher than $V_{SS}$ that is the reference potential, comparator COMP1 outputs −1 (low level), up-down counter 121 counts down, and the count value is stored in register 1. Comparator circuit 125 compares whether or not the substrate voltage setting upper limit value or lower limit value is exceeded, and stores the results of the comparison in register 2. DA converter 128 then outputs a substrate voltage corresponding to the value of register 2, and lowers (deepens) the substrate voltage of leakage current detection NchMOS transistor $T_{n1}$. As a result, the threshold voltage of leakage current detection NchMOS transistor $T_{n1}$ becomes large, and source potential of NchMOS transistor $T_{n1}$ is lowered.

Conversely, if source potential of leakage current detection NchMOS transistor $T_{n1}$ is lower than $V_{SS}$ that is the reference potential, comparator COMP1 outputs +1 (high level), up-down counter 121 counts up, and the count value is stored in register 1. Comparator circuit 125 compares whether or not the substrate voltage setting upper limit value or lower limit value is exceeded, and stores the results of the comparison in register 2. DA converter 128 then outputs a substrate voltage corresponding to the value of register 2, and raises (makes shallow) the substrate voltage of leakage current detection NchMOS transistor $T_{n1}$. As a result, the threshold voltage of leakage current detection NchMOS transistor $T_{n1}$ becomes small, and source potential of NchMOS transistor $T_{n1}$ is raised.

By repeating the above operation, the source potential of leakage current detection NchMOS transistor $T_{n1}$ finally converges to become the same potential as $V_{SS}$.

The lower limit of the output of substrate voltage control block 120 is preferably set to a voltage in a range where a GIDL (Gate-Induced Drain Leakage) effect does not occur at the NchMOS transistor. The GIDL effect is an effect where sub-threshold current increases when an excessive back-bias that is a negative voltage with respect to the substrate, is applied. Further, it is preferable for the upper limit of the output of substrate voltage control block 120 to be set to a voltage in a range where the MOS transistor does not exhibit bipolar characteristics. When a forward bias that is a positive voltage with respect to the substrate, is excessively applied, the MOS transistor exhibits bipolar characteristics, and the gain of the feedback of the threshold control circuit becomes extremely large and the feedback system oscillates, so it is therefore necessary to prevent this.

As described above, leakage current detection circuit 110 utilizes a source-follower circuit configured from leakage current detection NchMOS transistor $T_{n1}$ with a drain connected to the $V_{DD}$ terminal, a source connected to a constant current source, and an arbitrary stabilizing potential $V_{ref1}$ applied to a gate so that the substrate voltage is controlled by the substrate voltage control block. It is therefore possible for extremely slight changes (threshold level voltage fluctuations) appearing in source potential to be compared and detected by comparator COMP1 and it is therefore possible for detection sensitivity and response for detection potential of leakage current detection NchMOS transistor $T_{n1}$ to be raised dramatically compared to related art methods of detecting fluctuation of drain potential of the leakage current detection NchMOS transistor. As a result, it is possible to appropriately control the substrate voltage of the MOS transistor of the internal circuit 130 and enable threshold voltage control in low power supply voltage operation.

With regards to the control operation, it is possible to always carry out the threshold voltage control operation described above, and it is possible for this to be carried out when the internal circuit 130 is not operating, and for operation to be stopped when the source potential of leakage current detection NchMOS transistor $T_{n1}$ becomes the same potential as $V_{SS}$.

Second Embodiment

A second embodiment is an example applied to a leakage current detection circuit employing a leakage current detection PchMOS transistor.

Figure 2:
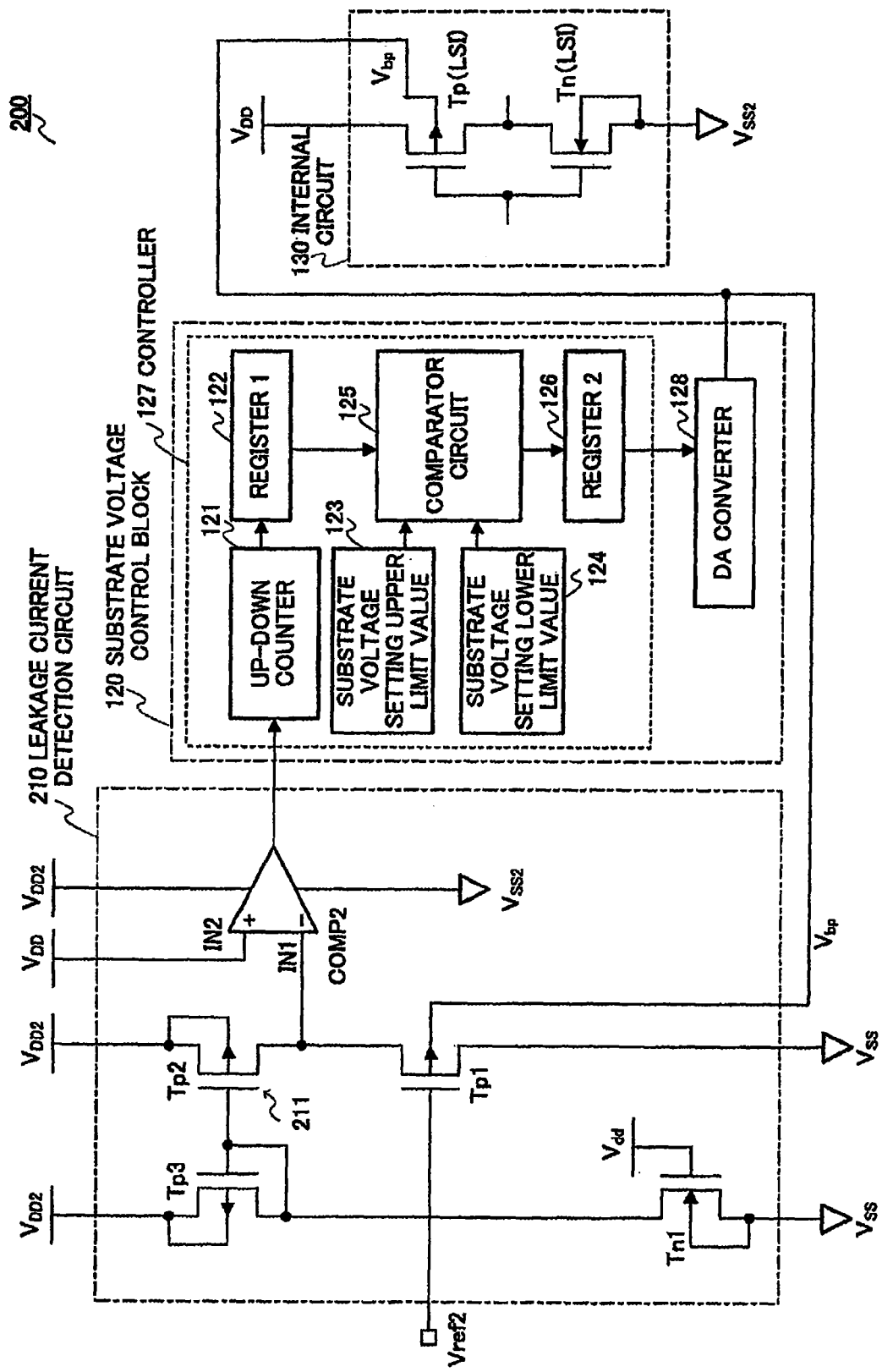
FIG. 2 is a view showing a configuration for a semiconductor integrated circuit apparatus of a second embodiment of the present invention.

FIG. 2 is a view showing a configuration for a semiconductor integrated circuit apparatus of a second embodiment of the present invention. In this embodiment, an example is given of application to semiconductor integrated circuit apparatus equipped with a PchMOS transistor leakage current detection circuit, substrate voltage control block, and internal circuit. Portions with the same configuration as for FIG. 1 are given the same numerals and are not described.

In FIG. 2, semiconductor integrated circuit apparatus 200 is comprised of PchMOS transistor leakage current detection circuit 210, substrate voltage control block 120, and internal circuit 130, and semiconductor integrated circuit apparatus 200 controls the threshold voltages of PchMOS transistors constituting internal circuit 130.

Leakage current detection circuit 210 is comprised of leakage current detection PchMOS transistor $T_{p1}$ with a drain connected to the $V_{SS}$ terminal, a source connected to a constant current source, and an arbitrary stabilizing voltage $V_{ref2}$ applied to a gate so that substrate voltage is controlled by substrate voltage control block 120, comparator COMP2 with a source of PchMOS transistor $T_{p1}$ connected to one input terminal IN1, and $V_{DD}$ applied to the other input terminal IN2 as a reference potential, and constant current source 211 supplying a constant current to leakage current detection PchMOS transistor $T_{p1}$.

Constant current source 211 is comprised of NchMOS transistor $T_{n1}$ with a source connected to the $V_{SS}$ terminal and a gate connected to the $V_{DD}$ terminal, and PchMOS transistor $T_{p2}$ that has a source connected to the $V_{DD2}$ terminal and that constitutes a current mirror circuit together with PchMOS transistor $T_{p3}$ with a gate and drain connected to the drain of $T_{n1}$ and a source connected to the $V_{DD2}$ terminal.

Comparator COMP2 is configured from a comparator and operational amplifier, and if the source potential of leakage current detection PchMOS transistor $T_{p1}$ is higher than the reference potential of $V_{DD}$, −1 (a low level) is outputted, and if lower, +1 (a high level) is outputted. The output signal of comparator COMP2 is inputted to up-down, counter 121 inside controller 127, with a down-count being performed at the time of −1, and an up-count being performed at the time of +1. The count value is then stored in register 1. In a separate method, use of an adder-subtractor is possible.

$V_{DD2}$ that is a voltage higher than $V_{DD}$ and $V_{SS}$ are applied to comparator COMP2 as power supply voltages. In this embodiment, a difference from the example of the related art is that, instead of connecting the drains of the plurality of PchMOS transistors or NchMOS transistors of internal circuit 130 to the $V_{SS}$ terminal, the $V_{DD}$ terminal is connected to the sources of the plurality of PchMOS transistors of the internal circuit. Output of comparator COMP2 is inputted to substrate voltage control block.

Substrate voltage control block 120 may be an analog method circuit or a digital method circuit but here, as in the first embodiment, a description is given of an example of a digital method circuit. Substrate voltage control block 120 is configured from controller 127 comprised of up-down counter 121 carrying out substrate voltage control, register 122 (register 1), substrate voltage setting upper limit value register 123, substrate voltage setting lower limit value register 124, comparator circuit 125 and register 126 (register 2), and DA converter 128 receiving a digital value from controller 127 and generating a substrate voltage. Controller 127 carries out control in such a manner as to change substrate voltage of leakage current detection PchMOS transistor $T_{p1}$ by changing a count value of the up-down counter based on the output of comparator COMP2. DA converter 128 DA converts a digital value from controller 127 and generates a substrate voltage. The substrate voltage generated by DA converter 128 is applied to the substrate of leakage current detection PchMOS transistor $T_{p1}$ of leakage current detection circuit 120 and the substrate of the PchMOS transistor of internal circuit 130.

Internal circuit 130 may be any kind of circuit providing that this is a circuit where threshold voltages of PchMOS transistors of the internal circuit are controlled by semiconductor integrated circuit apparatus 200 but here an example is adopted of a CMOS circuit where a PchMOS transistor and an NchMOS transistor are connected in series and have a common gate.

Leakage current detection PchMOS transistor $T_{p1}$ may be arranged on the same substrate as the PchMOS transistor of internal circuit 130 or may be arranged on a separate substrate and electrically connected.

An upper limit of the output of substrate voltage control block 120 is $V_{DD}$ of internal circuit 130 or more and a lower limit is less than $V_{DD}$ of internal circuit 130. A substrate voltage setting upper limit value and a substrate voltage setting lower limit value are stored in registers 123 and 124 within controller 127 and comparison with the value of register 1 is carried out at comparator circuit 125. In the event that the value of register 1 exceeds the substrate voltage setting upper limit value, this substrate voltage setting upper limit value is outputted. In the event that the value of register 1 exceeds the substrate voltage setting lower limit value, this substrate voltage setting lower limit value is outputted. If the value of register 1 is between the substrate voltage setting lower limit value and the substrate voltage setting upper limit value, the value of register 1 is outputted. The outputted comparison results are then stored in register 2. Namely, the value of register 2 does not exceed the upper limit and lower limit of the substrate voltage setting value.

The value of register 2 from controller 127 is inputted to DA converter 128, and a substrate voltage corresponding to register 2 from DA converter 128 is applied to the substrate of leakage current detection PchMOS transistor $T_{p1}$ and the substrate of the PchMOS transistor of internal circuit 130. As with the first embodiment, it is possible for the output of DA converter 128 to generate a substrate voltage via a buffer (an impedance circuit with an output of the DA converter connected to a +input terminal of an operational amplifier, and with the −input terminal and output terminal of the operational amplifier linked) using, for example, an operational amplifier.

A description is now given of a substrate voltage control operation for semiconductor integrated circuit apparatus 200 of the configuration described above.

First, before starting the substrate voltage control operation, a count value of up-down counter 121 and values of registers 122 and 126 (register 1 and 2) are set to zero (0) or are set to the value measured the previous time. If source potential of leakage current detection PchMOS transistor $T_{p1}$ is higher than $V_{DD}$ that is the reference potential, comparator COMP2 outputs −1 (low level), up-down counter 121 counts down, and the count value is stored in register 1. Comparator circuit 125 compares whether or not the substrate voltage setting upper limit value or lower limit value is exceeded, and stores the results of the comparison in register 2. DA converter 128 then outputs a substrate voltage corresponding to the value of register 2, and lowers (makes shallower) the substrate voltage of leakage current detection PchMOS transistor $T_{p1}$. As a result, the threshold voltage of leakage current detection PchMOS transistor $T_{p1}$ becomes small, and source potential of PchMOS transistor $T_{p1}$ is lowered.

Conversely, if source potential of leakage current detection PchMOS transistor $T_{p1}$ is lower than $V_{DD}$ that is the reference potential, comparator COMP2 outputs +1 (high level), up-down counter 121 counts up, and the count value is stored in register 1. Whether or not the substrate voltage setting upper limit value or lower limit value is exceeded is then compared, and the results of the comparison are stored in register 2. DA converter 128 then outputs a substrate voltage corresponding to the value of register 2, and lowers (deepens) the substrate voltage of leakage current detection PchMOS transistor $T_{p1}$. As a result, the threshold voltage of leakage current detection PchMOS transistor $T_{p1}$ becomes larger, and source potential of PchMOS transistor $T_{p1}$ is raised.

By repeating the above operation, the source potential of leakage current detection PchMOS transistor $T_{p1}$ finally converges to become the same potential as $V_{DD}$.

The upper limit of the output of substrate voltage control block 120 is preferably set to a voltage in a range where a GIDL effect does not occur at the PchMOS transistor. Further, it is preferable for the lower limit of the output of substrate voltage control block 120 to be set to a voltage in a range where the PchMOS transistor does not exhibit bipolar characteristics.

In this way, according to this embodiment, the same effects as with the first embodiment are also obtained for leakage current detection circuit 210 employing a leakage current detection PchMOS transistor, and it is possible to improve detection sensitivity and response of detection potential of the leakage current detection PchMOS transistor $T_{p1}$.

With regards to the control operation, it is possible to always carry out the threshold voltage control operation described above, and it is possible for this to be carried out when the internal circuit 130 is not operating, and for operation to be stopped when the source potential of leakage current detection PchMOS transistor $T_{p1}$ becomes the same potential as $V_{DD}$.

Third Embodiment

In a third embodiment, an example is given of respectively controlling substrate voltage of a PchMOS transistor and an NchMOS transistor constituting a CMOS circuit at the internal circuit using the semiconductor integrated circuit apparatus of both the first and second embodiments.

Figure 3:
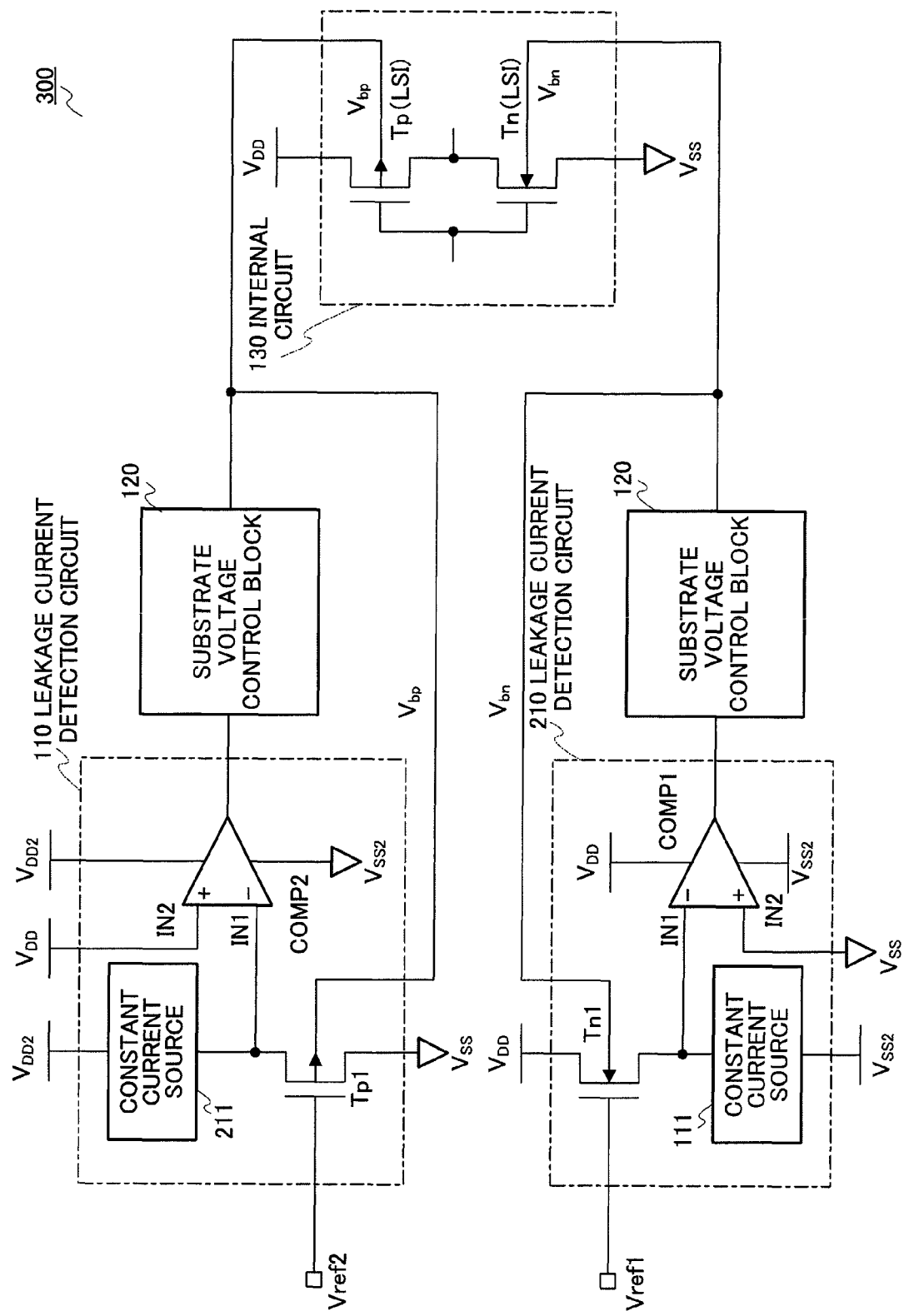
FIG. 3 is a view showing a configuration for a semiconductor integrated circuit apparatus of a third embodiment of the present invention.

FIG. 3 is a view showing a configuration for a semiconductor integrated circuit apparatus of a third embodiment of the present invention. Portions with the same configuration as for FIG. 1 and FIG. 2 are given the same numerals and are not described.

In FIG. 3, semiconductor integrated circuit apparatus 300 is comprised of NchMOS transistor leakage current detection circuit 110, PchMOS transistor leakage current detection circuit 210, two substrate voltage control blocks 120, and internal circuit 130, and semiconductor integrated circuit apparatus 300 controls the threshold voltage of an NchMOS transistor and PchMOS transistor constituting internal circuit 130.

In this way, according to this embodiment, the same effects are also obtained for CMOS circuits, and it is possible to improve detection sensitivity and response of detection potential for leakage current detection NchMOS transistor $T_{n1}$ and leakage current detection PchMOS transistor $T_{p1}$. Further, as a result of application in an internal circuit using CMOS circuits, it is possible to exert control both simultaneously and in an optimum manner on threshold voltages of the PchMOS transistor and NchMOS transistor.

Fourth Embodiment

In a fourth embodiment, an example is give of application in a leakage current detection circuit canceling DC offset of a comparator.

Figure 4:
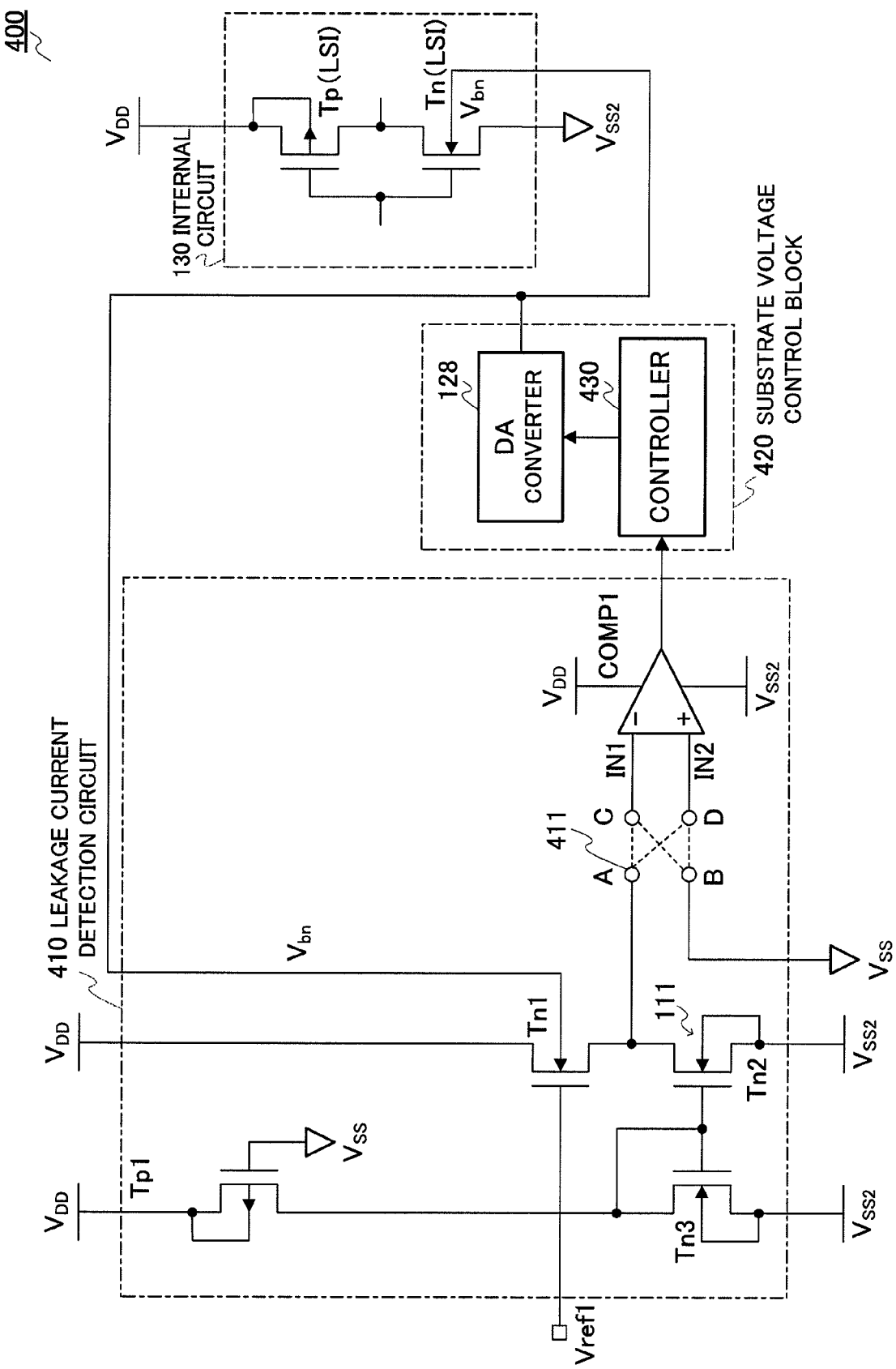
FIG. 4 is a view showing a configuration for a semiconductor integrated circuit apparatus of a fourth embodiment of the present invention.

FIG. 4 is a view showing a configuration for a semiconductor integrated circuit apparatus of a fourth embodiment of the present invention. In this embodiment, an example is given of application to semiconductor integrated circuit apparatus equipped with an NchMOS transistor leakage current detection circuit, substrate voltage control block, and internal circuit. Portions with the same configuration as for FIG. 1 are given the same numerals and are not described.

In FIG. 4, semiconductor integrated circuit apparatus 400 is comprised of NchMOS transistor leakage current detection circuit 410, substrate voltage control block 420 carrying out substrate voltage control, and internal circuit 130, and semiconductor integrated circuit apparatus 400 controls the threshold voltage of the NchMOS transistor constituting internal circuit 130.

Leakage current detection circuit 410 is comprised of leakage current detection NchMOS transistor $T_{n1}$ with a drain connected to the $V_{DD}$ terminal, a source connected to a constant current source, and an arbitrary stabilizing voltage $V_{ref1}$ applied to a gate so that substrate voltage is controlled by substrate voltage control block 420, comparator COMP1 with a source of NchMOS transistor $T_{n1}$ connected to one input terminal IN1, and $V_{SS}$ applied to the other input terminal IN2 as a reference potential, input switching switch 411 provided between respective input terminals IN1 and IN2 of comparator COMP1 and the source of NchMOS transistor $T_{n1}$ and $V_{SS}$ terminal, switching between the source of NchMOS transistor $T_{n1}$ and $V_{SS}$ terminal and the respective input terminals of COMP1 when internal circuit 130 is not operating, and constant current source 111 supplying a constant current to leakage current detection NchMOS transistor $T_{n1}$.

Substrate voltage control block 420 is comprised of controller 430 controlling changing of a substrate voltage applied to substrates of leakage current detection NchMOS transistor $T_{n1}$ and NchMOS transistors of internal circuit 130 by comparing the output of comparator COMP1 with reference potentials determined in advance, and DA converter 128 DA converting a digital value from controller 430 and generating a substrate voltage. Further, substrate voltage control block 420 is configured from a digital circuit because of the ease of switching control of input switching switch 411 and the ease of offset adjustment amount operation control.

In this embodiment, at semiconductor integrated circuit apparatus 100 of FIG. 1, input switching switch 411 is provided between the respective input terminals IN1 and IN2 of comparator COMP1 and the source of NchMOS transistor $T_{n1}$ and the $V_{SS}$ terminal. Further, controller 430 of substrate voltage control block 420 is further equipped with functions for controlling switching of input switching switch 411 and controlling offset adjustment amount operations.

Figure 5:
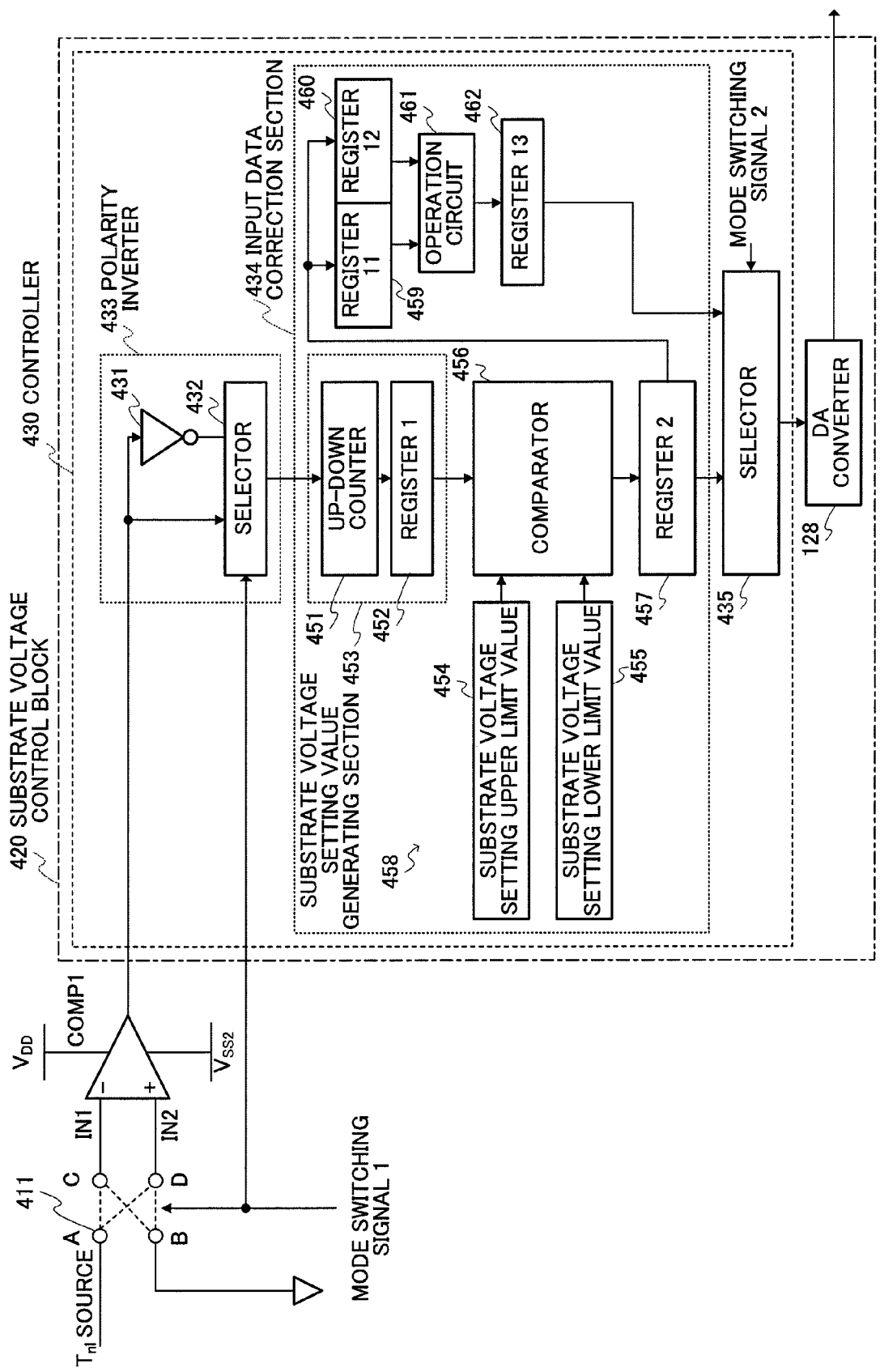
FIG. 5 is a view showing a circuit configuration for a controller of the fourth embodiment.

FIG. 5 is a view showing a circuit configuration for controller 430.

In FIG. 5, controller 430 is configured from polarity inverter 433 composed of inverter 431 and selector 432, for selectively inverting polarity of output signals of comparator COMP1, input data correction section 434, and selector 435 for switching between register 2 and register 13.

Input switching switch 411 and polarity inverter 433 are controlled by mode switching signal 1, and selector 435 is controlled by mode switching signal 2.

Input data correction section 434 is configured from substrate voltage setting value generating section 453 composed of up-down counter 451 and register 452 (register 1) and employing a method of successive comparison where one LSB (least significant bit) is changed at a time, substrate voltage setting value upper limit lower limit comparator circuit 458 composed of substrate voltage setting upper limit value register 454, substrate voltage setting lower limit value register 455, comparator circuit 456 and register 457 (register 2), register 459 (register 11) and register 460 (register 12) for temporarily storing a first substrate voltage setting value and second substrate voltage setting value, operation circuit 461, and register 462 (register 13) for storing operation results.

A description is now given of the operation of semiconductor integrated circuit apparatus 400 of the configuration described above. The overall operation of substrate voltage control of semiconductor integrated circuit apparatus 400 is the same as for the first embodiment.

First, a description of the operation for compensating DC offset of comparator COMP1 occurring at the substrate voltage control operation is given.

This operation is carried out by an operation (first input mode) obtaining a first substrate voltage setting value occurring when internal circuit 130 is not operating, an operation (second input mode) obtaining a second substrate voltage setting value, and an operation (operation mode) obtaining a third substrate voltage setting value.

It is then possible to eliminate DC offset of comparator COMP1 by applying the substrate voltage using the third substrate voltage setting value obtained in this manner.

As shown in FIG. 5, input switching switch 411 has a function for selectively connecting input terminal A and B to either of output terminals C and D.

At the time of the first input mode, input switching switch 411 is such that A terminal and C terminal are connected, and B terminal and D terminal are connected, with selector 432 of polarity inverter 433 allowing the output signal of comparator COMP1 to pass as is.

The output signal of comparator COMP1 is then provided to up-down counter 451 functioning as substrate voltage setting value generating section 453.

First, before starting the substrate voltage control operation, a count value of up-down counter 451 and the value of register 452 (register 1) are set to zero (0) or are set to the value measured the previous time. Next, up-down counter 451 counts up when the output signal of comparator COMP1 provided at this time is +1 (high level) and counts down when −1 (low level), and stores this count value in register 1.

A substrate voltage setting upper limit value and a substrate voltage setting lower limit value stored in input data correction section 434 and the value of register 1 are compared using a comparator circuit. In the event that the value of register 1 exceeds the substrate voltage setting upper limit, this substrate voltage setting upper limit value is outputted. In the event that the value of register 1 exceeds the substrate voltage setting lower limit value, this substrate voltage setting lower limit value is outputted. If the value of register 1 is between the substrate voltage setting lower limit value and the substrate voltage setting upper limit value, the value of register 1 is outputted. The outputted comparison results are then stored in register 457 (register 2).

The value of register 2 is then inputted to DA converter 128 from input data correction section 434 via selector 435 using mode switching signal 2. As a result, a substrate voltage corresponding to register 2 from DA converter 128 is applied to the substrate of leakage current detection NchMOS transistor $T_{n1}$ and the substrate of the NchMOS transistors of internal circuit 130.

Namely, if source potential of leakage current detection NchMOS transistor $T_{N1}$ is higher than $V_{SS}$ that is the reference potential, comparator COMP1 outputs −1 (low level), up-down counter counts down, and the count value is stored in register 1. Comparator circuit 456 compares whether or not the substrate voltage setting upper limit value or lower limit value is exceeded, and stores the results of the comparison in register 2. DA converter 128 then outputs a substrate voltage corresponding to the value of register 2, and lowers (deepens) the substrate voltage of leakage current detection NchMOS transistor $T_{n1}$. As a result, the threshold voltage of leakage current detection NchMOS transistor $T_{n1}$ becomes large, and source potential of NchMOS transistor $T_{n1}$ is lowered.

Conversely, if source potential of leakage current detection NchMOS transistor $T_{n1}$ is lower than $V_{SS}$ that is the reference potential, the comparator outputs +1 (high level), up-down counter counts up, and the count value is stored in register 1. Comparator circuit 456 compares whether or not the substrate voltage setting upper limit value or lower limit value is exceeded, and stores the results of the comparison in register 2. DA converter 128 then outputs a substrate voltage corresponding to the value of register 2, and raises (makes shallow) the substrate voltage of leakage current detection NchMOS transistor $T_{n1}$. As a result, the threshold voltage of leakage current detection NchMOS transistor $T_{n1}$ becomes small, and source potential of NchMOS transistor $T_{n1}$ is raised.

In the following, the aforementioned loop is gone through and the same operation is carried out, with this operation continuing until the polarity of the output signal of comparator COMP1 is inverted.

Namely, when inversion of the polarity of the output signal of comparator COMP1 is detected, substrate voltage setting value generating section 453 holds the count value (that is the first substrate voltage setting value) at this time in register 459 (register 11).

It is necessary for detection of inversion of polarity to be carried out taking into consideration slight swings in signal voltage.

Next, input switching switch 411 is controlled, A terminal and D terminal are connected, B terminal and C terminal are connected, and the second input mode is adopted.

At this time, selector 432 of polarity inverter 433 selects the output signal of inverter 431. Namely, a signal that is the output signal of comparator COMP1 with the polarity inverted is provided to up-down counter 451.

In this state, the count value of up-down counter 451 of substrate voltage setting value generating section 453 returns to zero (0) and the same operation as for the first input mode is carried out, or an operation is carried out to obtain the second substrate voltage setting value by continuing from the same count value as for the first substrate voltage setting value obtained in the first input mode. The second substrate voltage setting value obtained as a result is then stored in register 460 (register 12).

First and second substrate voltage setting values are then extracted from register 11 and register 12, the third substrate voltage setting value is calculated by taking an average value using operation circuit 461, and this is stored in register 462 (register 13).

This third substrate voltage setting value is the substrate voltage setting value (i.e. the substrate voltage setting value when the DC offset of comparator COMP1 is completely cancelled) in the event that there is no DC offset whatsoever at the comparator COMP1.

Therefore, at the time of normal operation of internal circuit 130, it is possible to completely cancel the DC offset of comparator COMP1 by controlling the selector using mode switching signal 2 and controlling substrate voltage of internal circuit 130 using the third substrate voltage setting value of register 13, and the precision of controlling substrate voltage is substantially improved.

According to this embodiment, input switching switch 411 is provided between the respective input terminals IN1 and IN2 of comparator COMP1 and the source of NchMOS transistor $T_{n1}$ and the $V_{SS}$ terminal. By then switching between the source of NchMOS transistor $T_{n1}$ and the $V_{SS}$ terminal and the respective input terminals of comparator COMP1 using input switching switch 411, substrate voltage adjustment is carried out two times, and respective substrate voltage setting values are stored in register 1 and register 2 within controller 430. The average of these substrate voltage setting values is then taken and stored in register 3. The substrate voltage of the internal circuit is then controlled using the substrate voltage setting value of register 3 at the time of normal operation of internal circuit 130. It is therefore possible to cancel DC offset errors of comparator COMP1 and it is possible to raise the precision of control of the substrate voltage.

Fifth Embodiment

A fifth embodiment is an example applied to a leakage current detection circuit employing a leakage current detection PchMOS transistor to cancel DC offset of a comparator.

Figure 6:
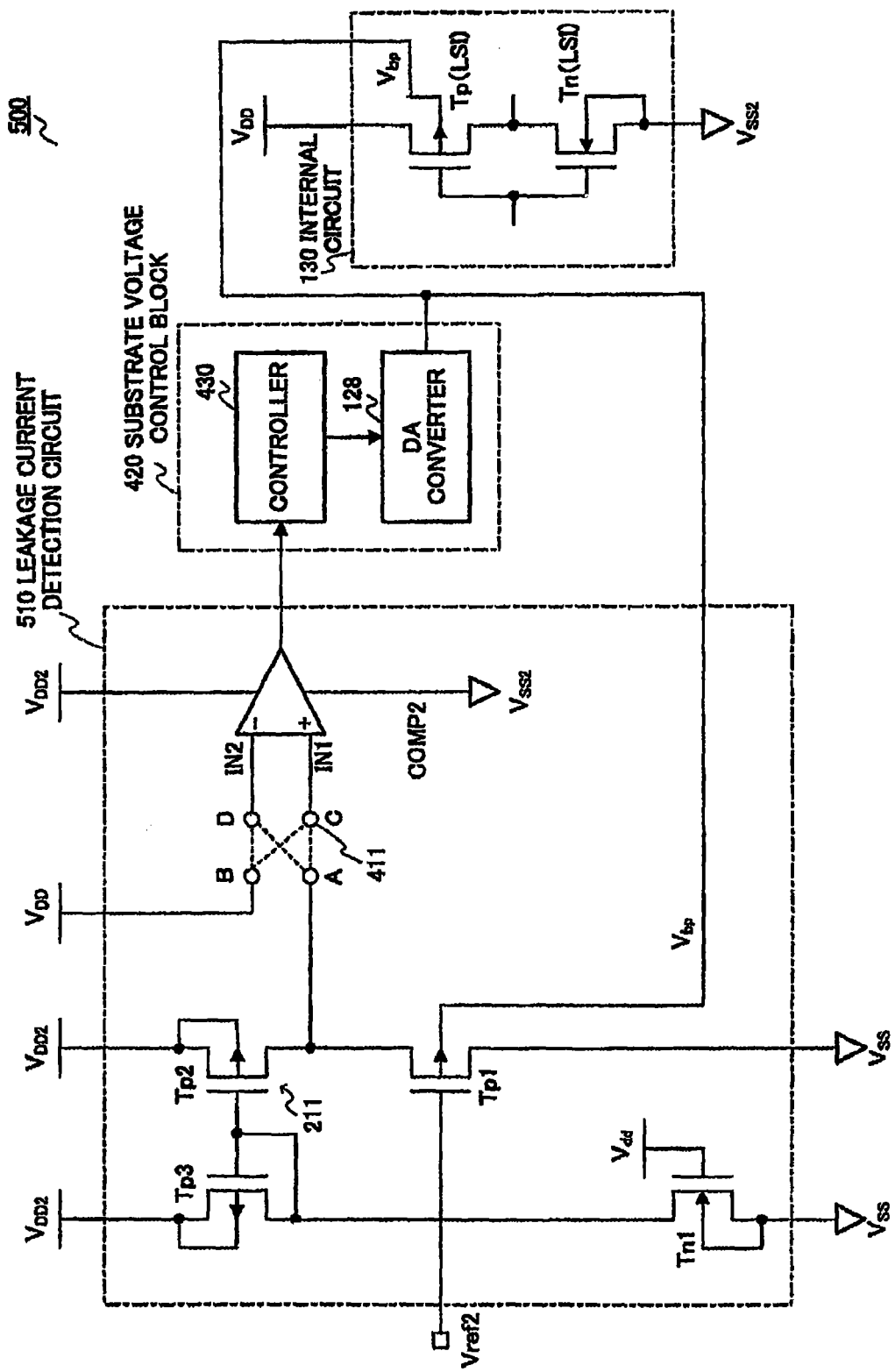
FIG. 6 is a view showing a configuration for a semiconductor integrated circuit apparatus of a fifth embodiment of the present invention.

FIG. 6 is a view showing a configuration for a semiconductor integrated circuit apparatus of the fifth embodiment of the present invention. In this embodiment, an example is given of application to semiconductor integrated circuit apparatus equipped with a PchMOS transistor leakage current detection circuit, substrate voltage control block, and internal circuit. Portions with the same configuration as for FIG. 2 and FIG. 4 are given the same numerals and are not described.

In FIG. 6, semiconductor integrated circuit apparatus 500 is comprised of PchMOS transistor leakage current detection circuit 510, substrate voltage control block 420, and internal circuit 130, and semiconductor integrated circuit apparatus 500 controls the threshold voltage of PchMOS transistors constituting internal circuit 130.

Leakage current detection circuit 510 is comprised of leakage current detection PchMOS transistor $T_{p1}$ with a drain connected to the $V_{SS}$ terminal, a source connected to a constant current source, and an arbitrary stabilizing voltage $V_{ref2}$ applied to a gate so that substrate voltage is controlled by a substrate voltage control block, comparator COMP2 with a source of PchMOS transistor $T_{p1}$ connected to one input terminal IN1, and $V_{DD}$ applied to the other input terminal IN2 as a reference potential, input switching switch 411 provided between respective input terminals IN1 and IN2 of comparator COMP2 and the source of PchMOS transistor $T_{p1}$ and $V_{DD}$ terminal, switching between the source of PchMOS transistor $T_{p1}$ and $V_{DD}$ terminal and the respective input terminals of COMP2 when internal circuit 130 is not operating, and constant current source 211 supplying a constant current to leakage current detection PchMOS transistor $T_{p1}$.

Substrate voltage control block 420 is comprised of controller 430 carrying out control of changing of the substrate voltage of leakage current detection PchMOS transistor $T_{p1}$ by changing the count value of an up-down counter based on the output of comparator COMP2 and DA converter 128 DA converting a digital value from controller 430 and generating a substrate voltage. Further, substrate voltage control block 420 is configured from a digital circuit because of the ease of switching control of input switching switch 411 and the ease of offset adjustment amount operation control.

The circuit configuration of controller 430 is the same as for FIG. 5.

The theory of the operation of semiconductor integrated circuit apparatus 500 of the fifth embodiment and the theory of the operation of canceling the DC offset error of comparator COMP2 are the same as for the fourth embodiment but with the NchMOS transistors substituted for PchMOS transistors.

It is therefore possible to obtain the same effects as with the fourth embodiment.

Sixth Embodiment

In a sixth embodiment, an example is given of respectively controlling substrate voltage of a PchMOS transistor and NchMOS transistor constituting a CMOS circuit at the internal circuit using the semiconductor integrated circuit apparatus of both the fourth and fifth embodiments.

Figure 7:
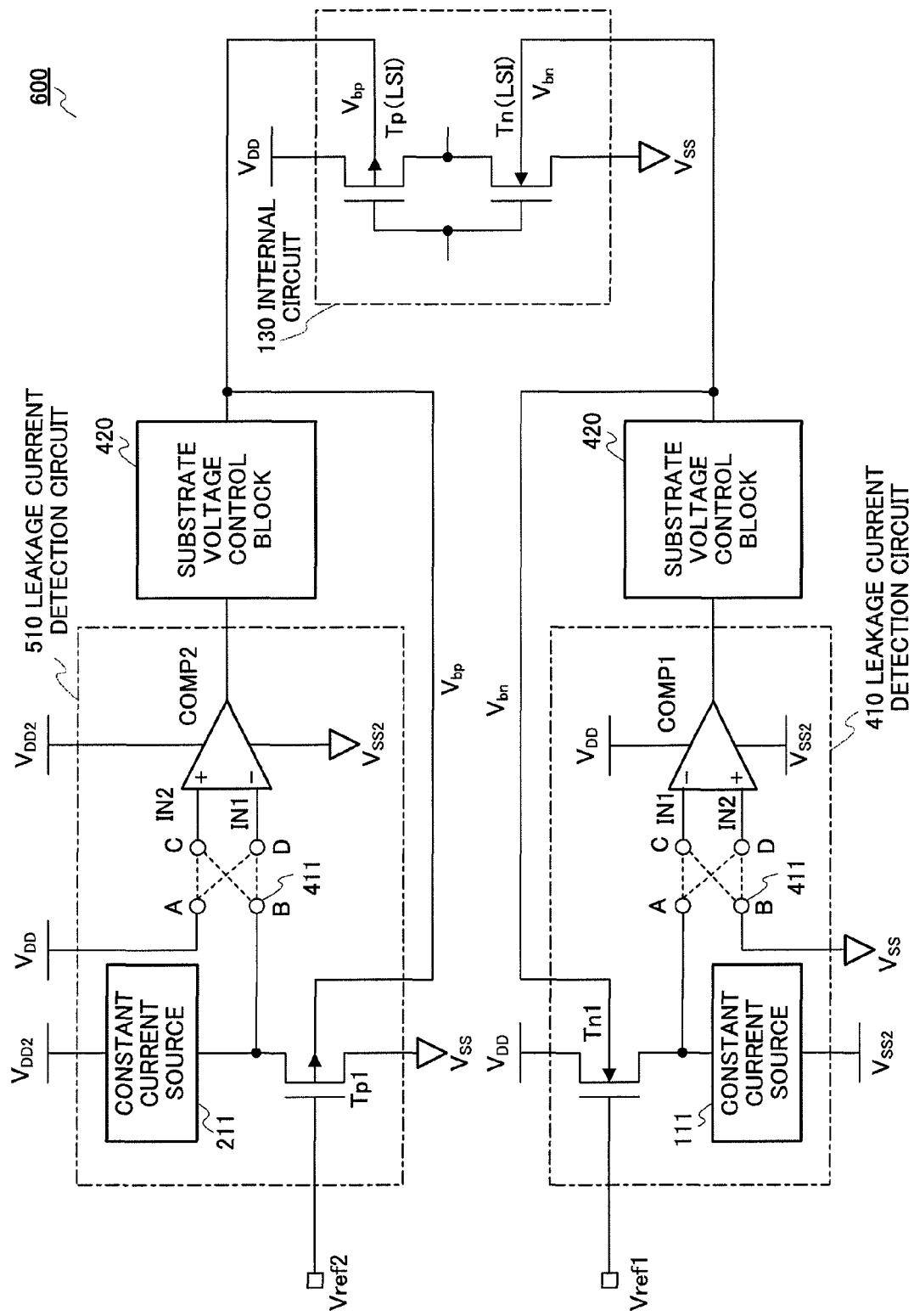
FIG. 7 is a view showing a configuration for a semiconductor integrated circuit apparatus of a sixth embodiment of the present invention.

FIG. 7 is a view showing a configuration for a semiconductor integrated circuit apparatus of the sixth embodiment of the present invention. Portions with the same configuration as for FIG. 4 and FIG. 6 are given the same numerals and are not described.

In FIG. 7, semiconductor integrated circuit apparatus 600 is comprised of NchMOS transistor leakage current detection circuit 410, PchMOS transistor leakage current detection circuit 510, two substrate voltage control blocks 420, and internal circuit 130, and semiconductor integrated circuit apparatus 600 controls the threshold voltage of an NchMOS transistor and PchMOS transistor constituting internal circuit 130.

Application is therefore similarly possible in a CMOS circuit and the same effects as with the third embodiment to the fifth embodiment can be obtained.

Seventh Embodiment

In a seventh embodiment, an example is given of application to a leakage current detection circuit canceling DC offset of a comparator in a substrate voltage control circuit of an NchMOS transistor.

Figure 8:
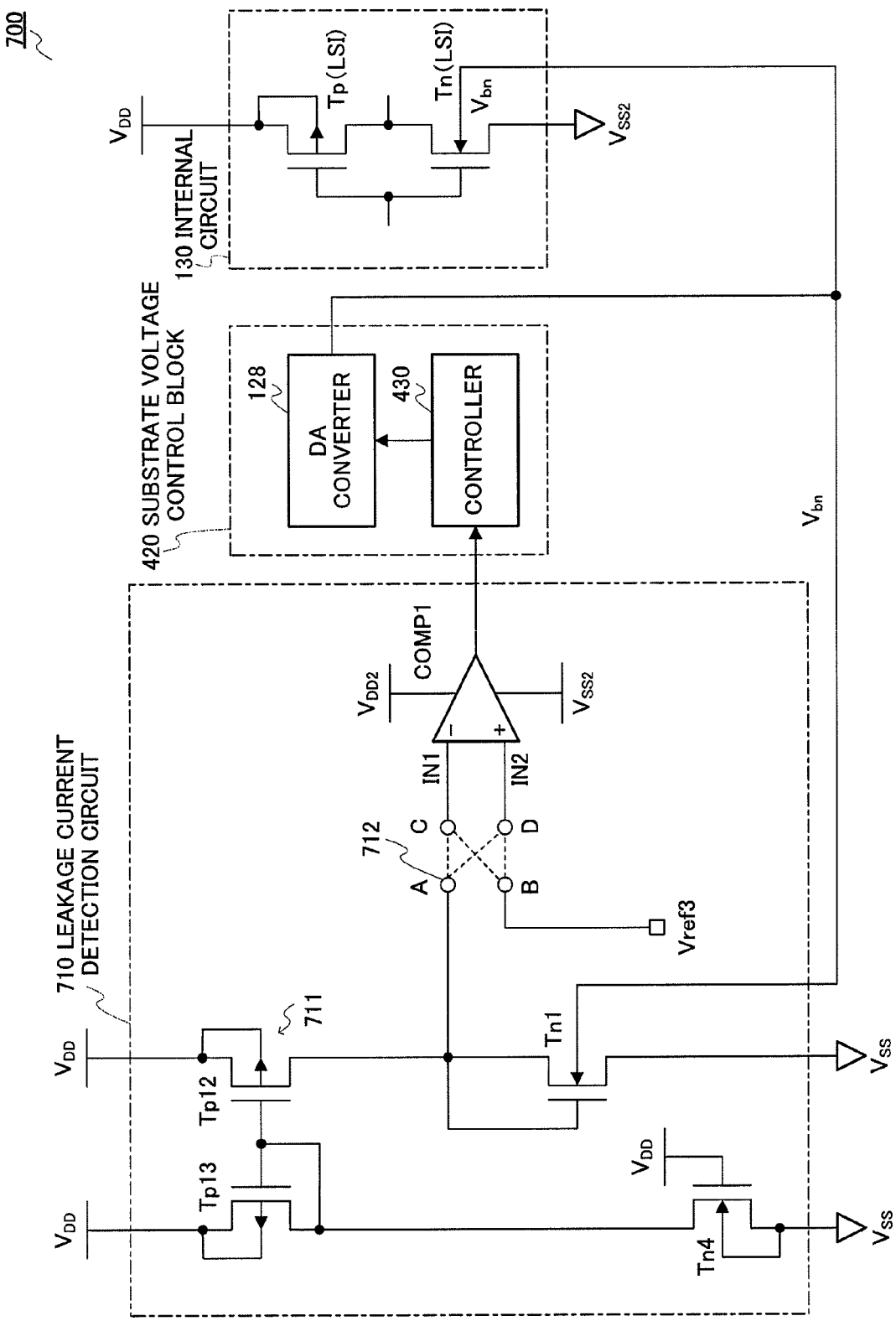
FIG. 8 is a view showing a configuration for a semiconductor integrated circuit apparatus of a seventh embodiment of the present invention

FIG. 8 is a view showing a configuration for a semiconductor integrated circuit apparatus of the seventh embodiment of the present invention. In this embodiment, an example is given of application to a semiconductor integrated circuit apparatus controlling NchMOS transistor threshold voltage configured from an NchMOS transistor drain potential detection circuit, substrate voltage control block configured from a controller and DA converter, and internal circuit. Portions with the same configuration as for FIG. 6 are given the same numerals and are not described.

In FIG. 8, semiconductor integrated circuit apparatus 700 is comprised of NchMOS transistor leakage current detection circuit 710, substrate voltage control block 420, and internal circuit 130, and semiconductor integrated circuit apparatus 700 controls the threshold voltage of NchMOS transistors constituting internal circuit 130.

Leakage current detection circuit 710 is comprised of leakage current detection NchMOS transistor $T_{n1}$ with a gate and drain connected to each other and connected to a constant current source, a source connected to the $V_{SS}$ terminal, and with the substrate voltage being controlled by substrate voltage control block 420, constant current source 711 supplying a constant current to leakage current detection NchMOS transistor $T_{n1}$, comparator COMP1 with the drain of NchMOS transistor $T_{n1}$ connected to one input terminal IN1 and $V_{ref3}$ applied to the remaining input terminal IN2 as a reference potential, and input switching switch 712 arranged between the respective input terminals IN1 and IN2 of comparator COMP1 and the drain of NchMOS transistor $T_{n1}$ and reference potential $V_{ref3}$ terminal, switching between the drain of NchMOS transistor $T_{n1}$ and reference potential $V_{ref3}$ terminal and the respective input terminals of comparator COMP1 when internal circuit 130 is not operating.

Constant current source 711 is comprised of NchMOS transistor $T_{n4}$ with a source connected to $V_{SS}$ and a gate connected to $V_{DD}$, and PchMOS transistor $T_{p12}$ that has a source connected to $V_{DD}$ and that constitutes a current mirror circuit together with PchMOS transistor $T_{p13}$ with a gate and drain connected to the drain of $T_{n4}$ and a source connected to $V_{DD}$.

Substrate voltage control block 420 is comprised of controller 430 carrying out control of changing of the substrate voltage of leakage current detect ion NchMOS transistor $T_{n1}$ by changing the count value of an up-down counter based on the output of comparator COMP1 and DA converter 128 DA converting a digital value from controller 430 and generating a substrate voltage. Further, substrate voltage control block 420 is configured from a digital circuit because of the ease of switching control of input switching switch 712 and offset adjustment amount operation control.

In this embodiment, at the substrate voltage control circuit for an NchMOS transistor of non-patent document 1, input switching switch 712 is provided between the respective input terminals IN1 and IN2 of the comparator and the drain of NchMOS transistor $T_{n1}$ and reference potential $V_{ref3}$ terminal.

Figure 9:
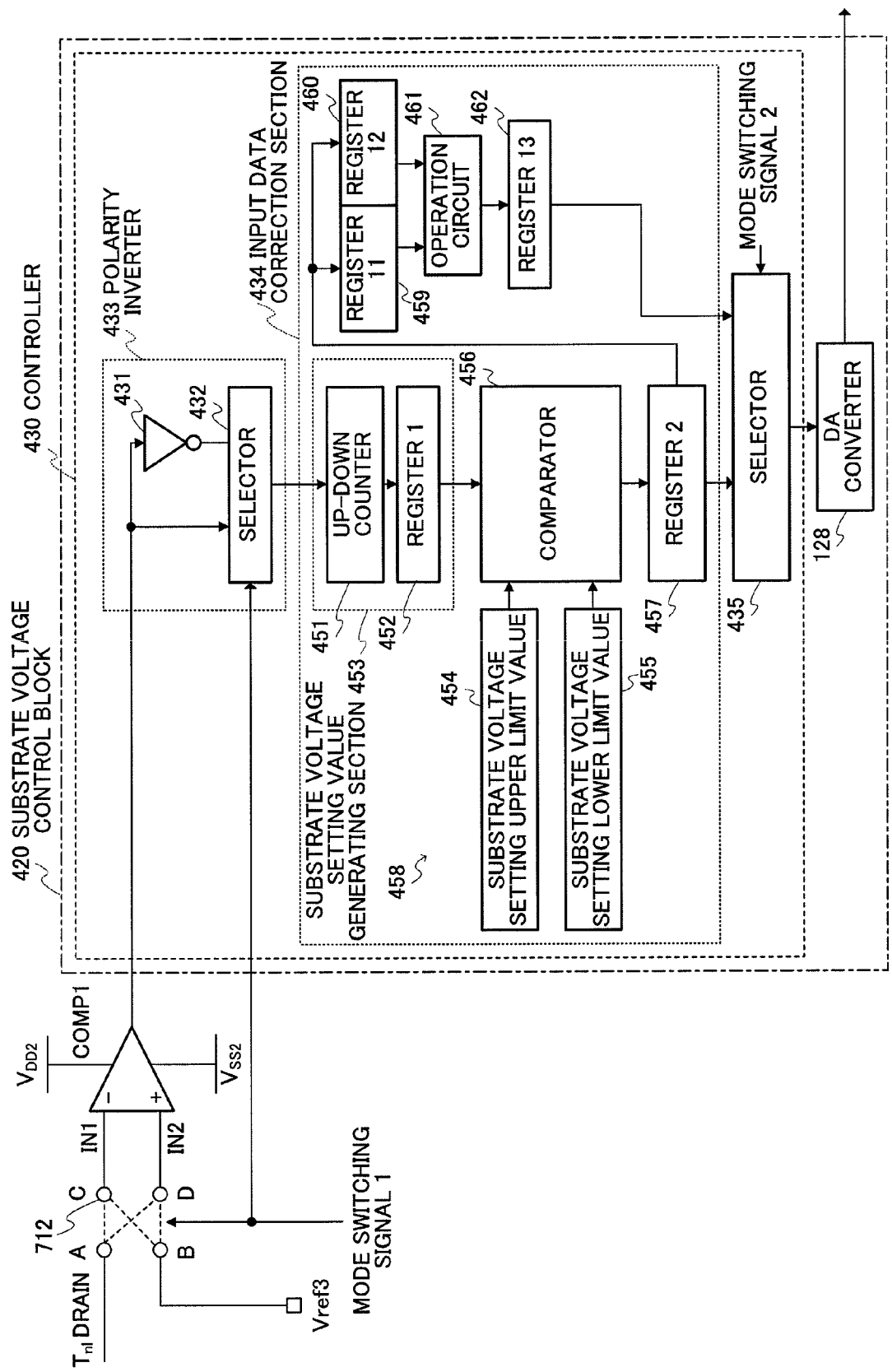
FIG. 9 is a view showing a circuit configuration for a controller of the seventh embodiment.

FIG. 9 is a view showing a circuit configuration for the controller 430, with portions of the configuration that are the same as for FIG. 5 being given the same numerals.

In FIG. 9, controller 430 is configured from polarity inverter 433 composed of inverter 431 and selector 432, for selectively inverting polarity of output signals of comparator COMP1, input data correction section 434, and selector 435 for switching between register 2 and register 13.

Input switching switch 712 and polarity inverter 433 are controlled by mode switching signal 1, and selector 435 is controlled by mode switching signal 2.

Input data correction section 434 is configured from substrate voltage setting value generating section 453 composed of up-down counter 451 and register 452 (register 1) and employing a method of successive comparison where one LSB is changed at a time, substrate voltage setting value upper limit lower limit comparator circuit 458 composed of substrate voltage setting upper limit value register 454, substrate voltage setting lower limit value register 455, comparator circuit 456 and register 457 (register 2), register 459 (register 11) and register 460 (register 12) for temporarily storing a first reference voltage setting value and second reference voltage setting value, operation circuit 461, and register 462 (register 13) for storing operation results.

At the time of the first input mode, input switching switch 712 is such that A terminal and C terminal are connected, and B terminal and D terminal are connected, with selector 432 of polarity inverter 433 allowing the output signal of the comparator to pass as is. Exactly the same substrate voltage control operation as for the fourth embodiment is then carried out, and the first substrate voltage setting value is stored in register 11.

At the time of the second input mode, input switching switch 712 is such that A terminal and D terminal are connected, and B terminal and C terminal are connected, with selector 432 of polarity inverter 433 causing the output signal of comparator COMP1 to be inverted. Exactly the same substrate voltage control operation as for the fourth embodiment is then carried out, and the second substrate voltage setting value is stored in register 12.

First and second substrate voltage setting values are then extracted from register 11 and register 12, the third substrate voltage setting value is calculated by taking an average value using operation circuit 461, and this is stored in register 13.

This third substrate voltage setting value is the substrate voltage setting value (i.e. the substrate voltage setting value when the DC offset of comparator is completely cancelled) in the event that there is no DC offset whatsoever at the comparator.

Therefore, at the time of normal operation of internal circuit, it is possible to completely cancel the DC offset error of comparator COMP1 by controlling selector 435 using mode switching signal 2 and controlling substrate voltage of internal circuit 130 using the third substrate voltage setting value of register 13, and the precision of controlling substrate voltage is substantially improved.

Eighth Embodiment

In a eighth embodiment, an example is given of application to a leakage current detection circuit employing a leakage current detection PchMOS transistor to cancel DC offset of a comparator.

Figure 10:
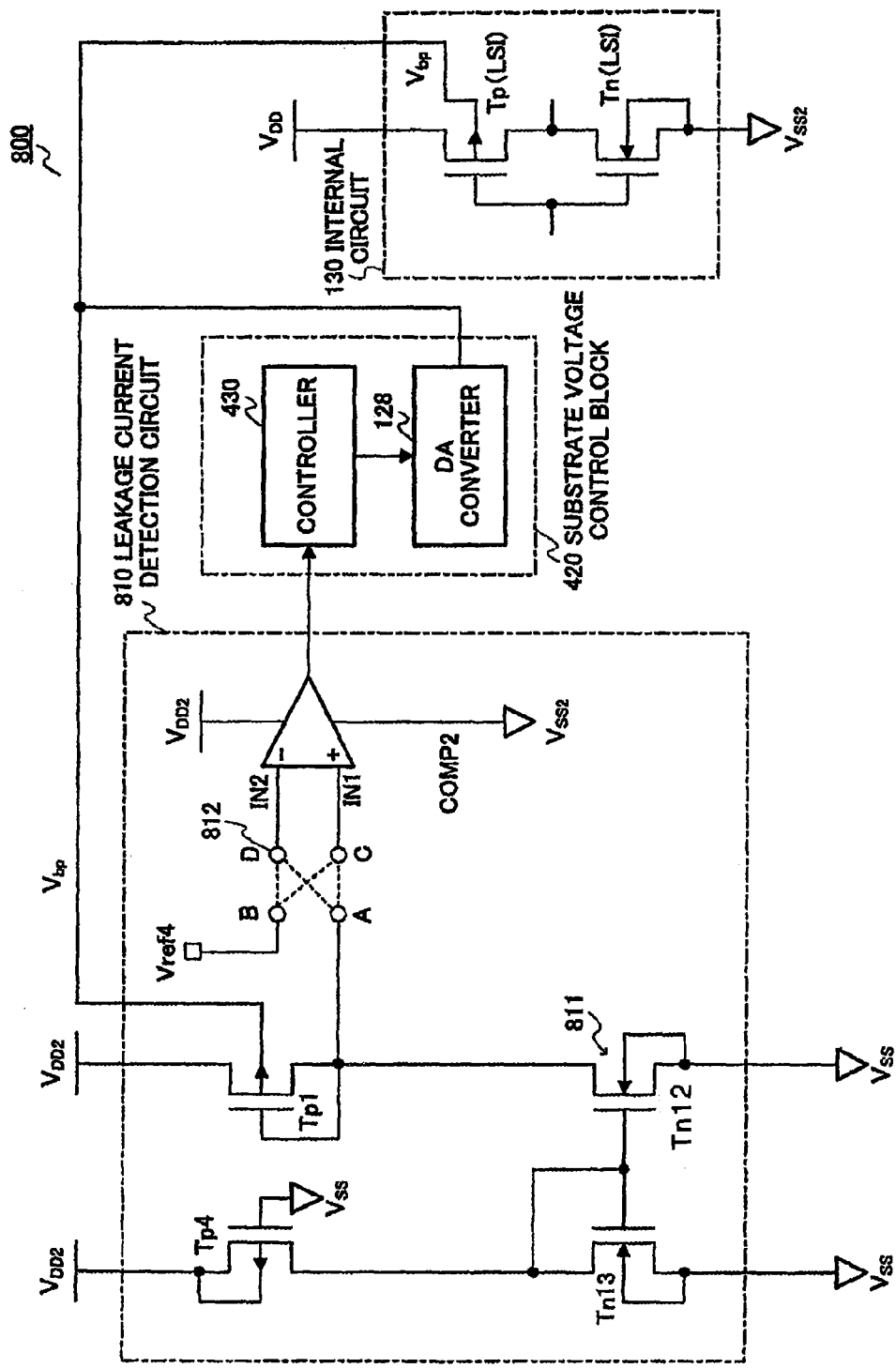
FIG. 10 is a view showing a configuration for a semiconductor integrated circuit apparatus of an eighth embodiment of the present invention.

FIG. 10 is a view showing a configuration for a semiconductor integrated circuit apparatus of the eighth embodiment of the present invention. In this embodiment, an example is given of application to a semiconductor integrated circuit apparatus controlling PchMOS transistor threshold voltage configured from a PchMOS transistor drain potential detection circuit, substrate voltage control block configured from a controller and DA converter, and internal circuit. Portions with the same configuration as for FIG. 4 and FIG. 8 are given the same numerals and are not described.

In FIG. 10, semiconductor integrated circuit apparatus 800 is comprised of PchMOS transistor leakage current detection circuit 810, substrate voltage control block 420, and internal circuit 130, and semiconductor integrated circuit apparatus 800 controls the threshold voltage of PchMOS transistors constituting internal circuit 130.

Leakage current detection circuit 810 is comprised of leakage current detection PchMOS transistor Tn1 with a gate and drain connected to each other and connected to a constant current source, a source connected to the $V_{DD}$ terminal, and with the substrate voltage being controlled by substrate voltage control block 420, constant current source 811 supplying a constant current to leakage current detection PchMOS transistor $T_{p1}$, comparator COMP2 with the drain of PchMOS transistor $T_{p1}$ connected to one input terminal $IN_1$ and $V_{ref4}$ applied to the other input terminal IN2 as a reference potential, and input switching switch 812 arranged between the respective input terminals IN1 and IN2 of comparator COMP2 and the drain of PchMOS transistor $T_{p1}$ and reference potential $V_{ref4}$ terminal, switching between the drain of PchMOS transistor $T_{p1}$ and reference potential $V_{ref4}$ terminal and the respective input terminals of comparator COMP2 when internal circuit 130 is not operating.

Constant current source 811 is comprised of PchMOS transistor $T_{p4}$ with a source connected to the $V_{DD}$ terminal and a gate connected to the $V_{SS}$ terminal, and NchMOS transistor $T_{n12}$ that has a source connected to the $V_{SS}$ terminal and that constitutes a current mirror circuit together with NchMOS transistor $T_{n13}$ with a gate and drain connected to the drain of $T_{p4}$ and a source connected to the $V_{SS}$ terminal.

Substrate voltage control block 420 is comprised of controller 430 carrying out control of changing of the substrate voltage of leakage current detection PchMOS transistor $T_{p1}$ by changing the count value of an up-down counter based on the output of comparator COMP2 and DA converter 128 DA converting a digital value from controller 430 and generating a substrate voltage.

Further, substrate voltage control block 420 is configured from a digital circuit because of the ease of switching control of input switching switch 812 and offset adjustment amount operation control.

The circuit configuration of controller 430 is the same as for FIG. 9.

The theory of the operation of semiconductor integrated circuit apparatus 800 of the eighth embodiment and the theory of the operation of canceling the DC offset of comparator COMP2 are the same as for the seventh embodiment but with the NchMOS transistors substituted for PchMOS transistors.

It is therefore possible to obtain the same effects as with the seventh embodiment.

Ninth Embodiment

In a ninth embodiment, an example is given of respectively controlling substrate voltage of a PchMOS transistor and NchMOS transistor constituting a CMOS circuit at the internal circuit using the semiconductor integrated circuit apparatus of both the seventh and eighth embodiments.

Figure 11:
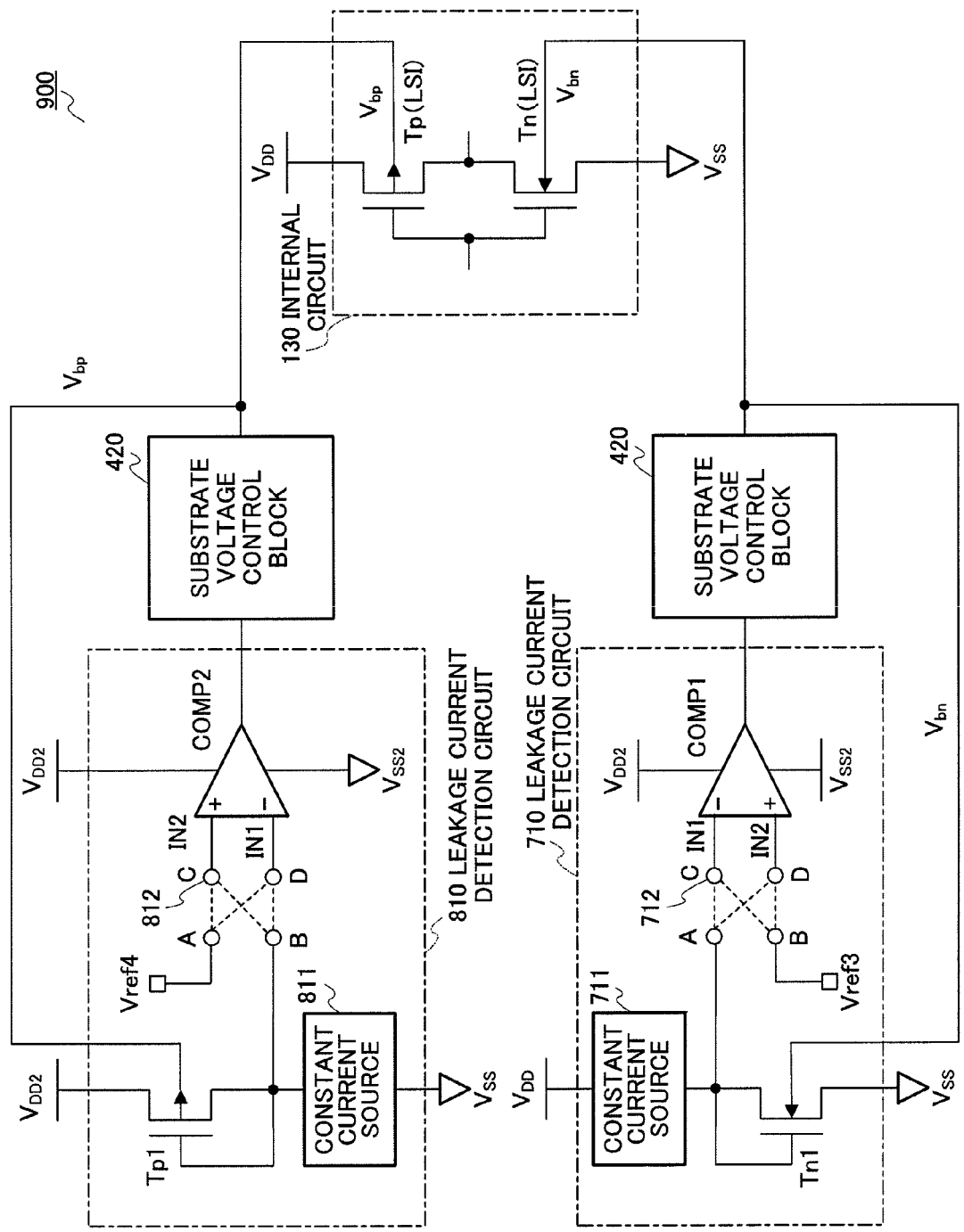
FIG. 11 is a view showing a configuration for a semiconductor integrated circuit apparatus of the eighth embodiment of the present invention.
Figure 12:
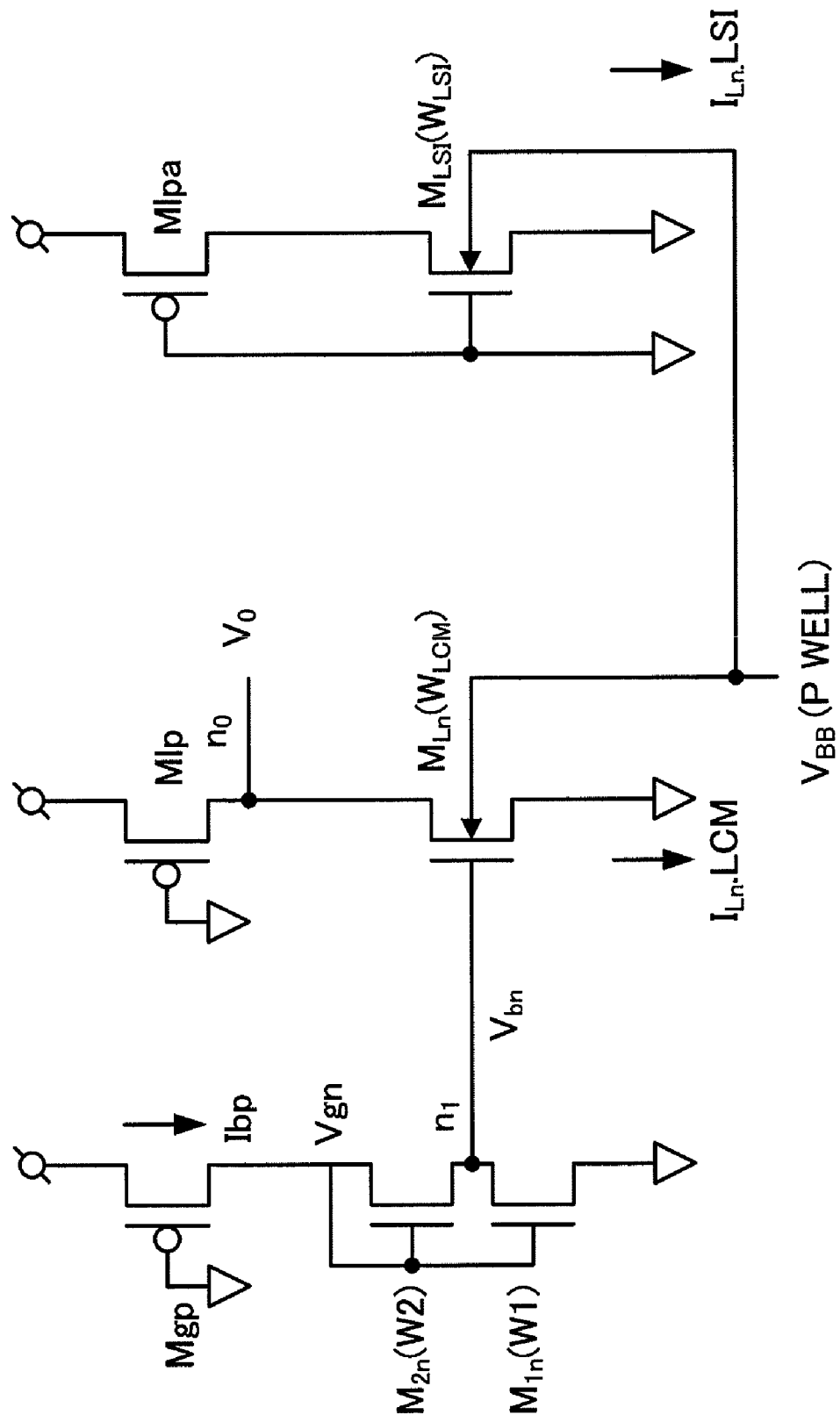
FIG. 12 is a view showing a configuration for a semiconductor integrated circuit controlling threshold voltage of an NchMOS transistor of the related art.
Figure 13:
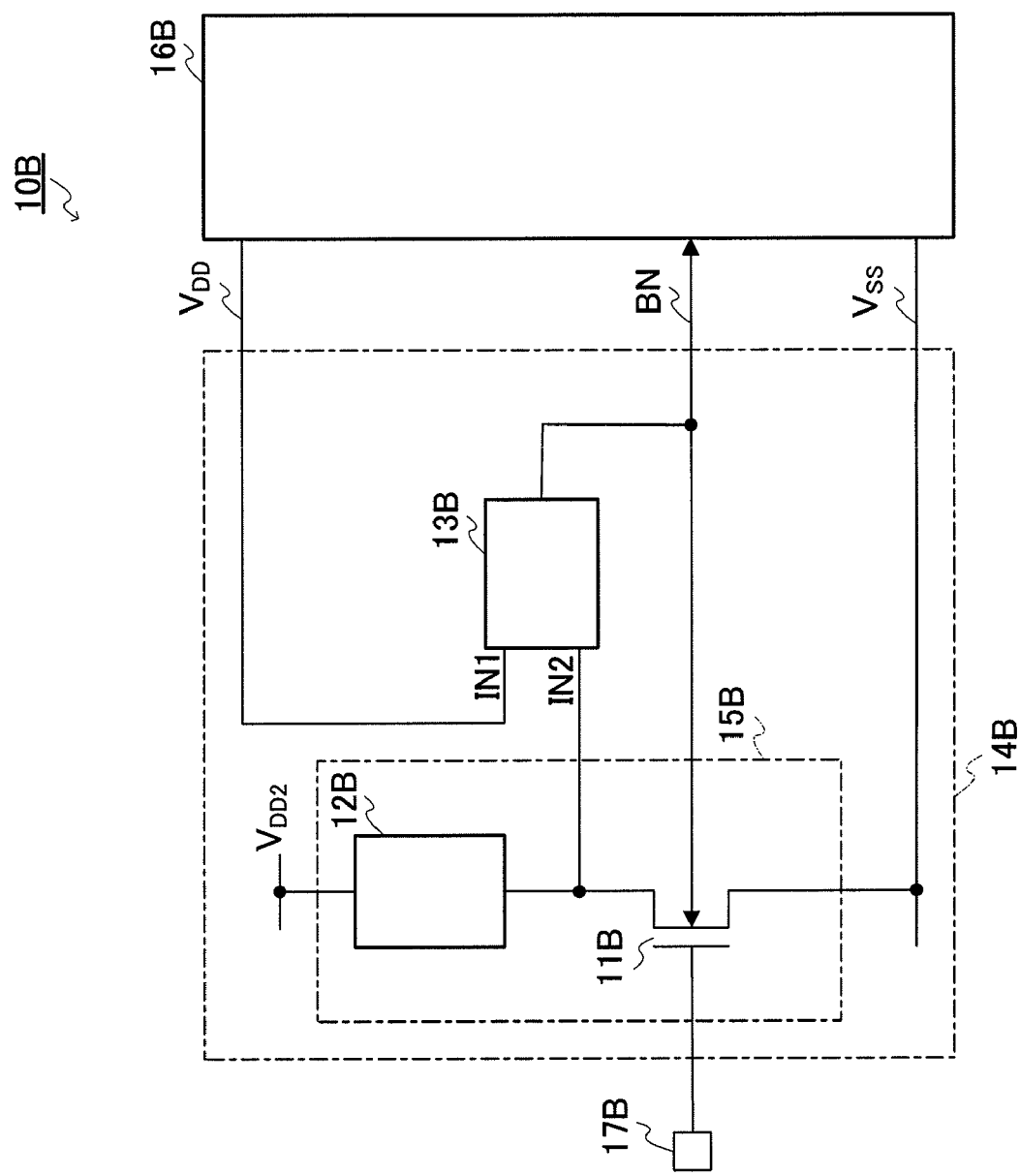
FIG. 13 is a further view showing a configuration for a semiconductor integrated circuit apparatus controlling threshold voltage of an NchMOS transistor of the related art.
Figure 14:
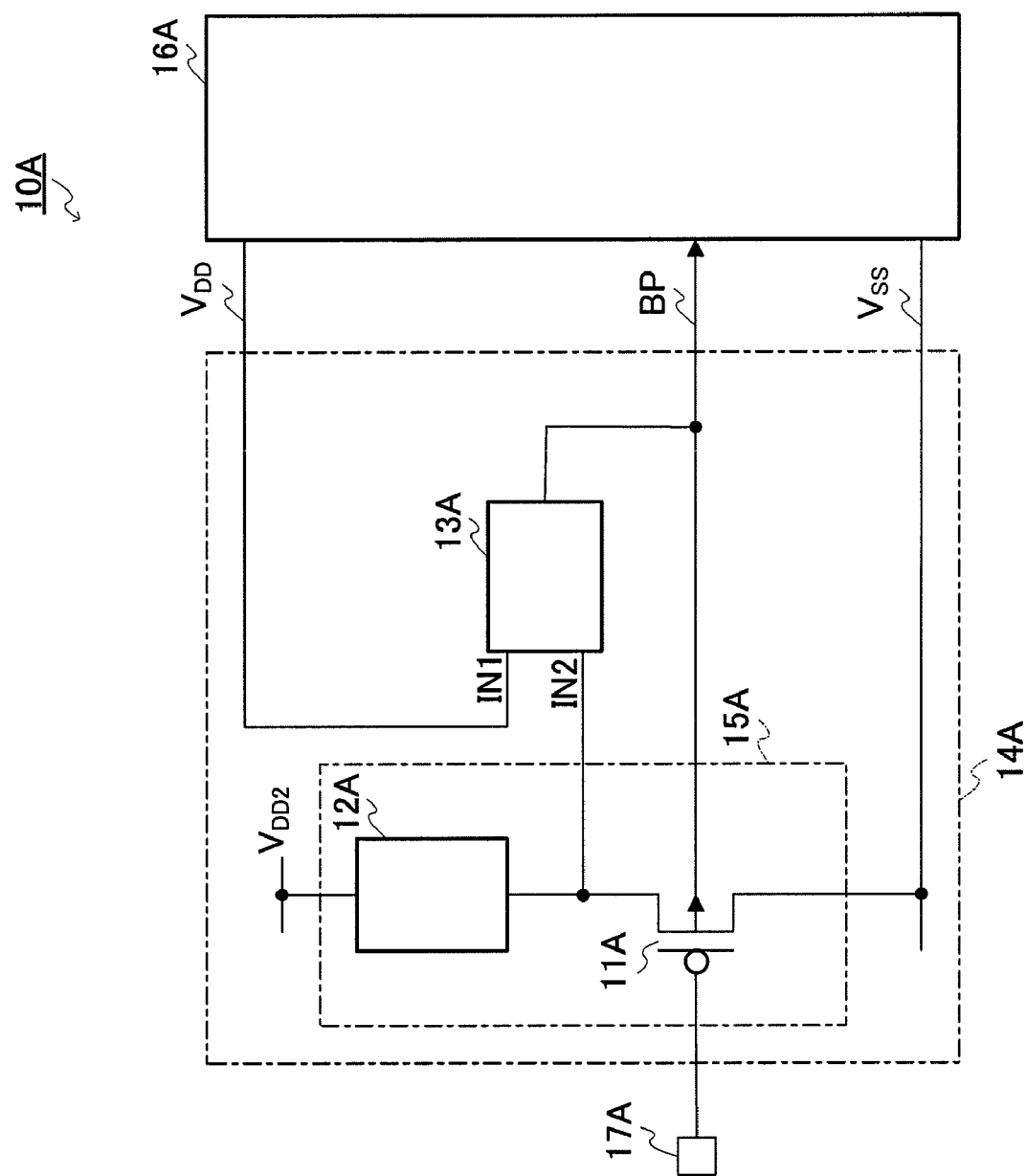
FIG. 14 is a view showing a configuration for a semiconductor integrated circuit apparatus controlling threshold voltage of an PchMOS transistor of the related art.
Figure 15:
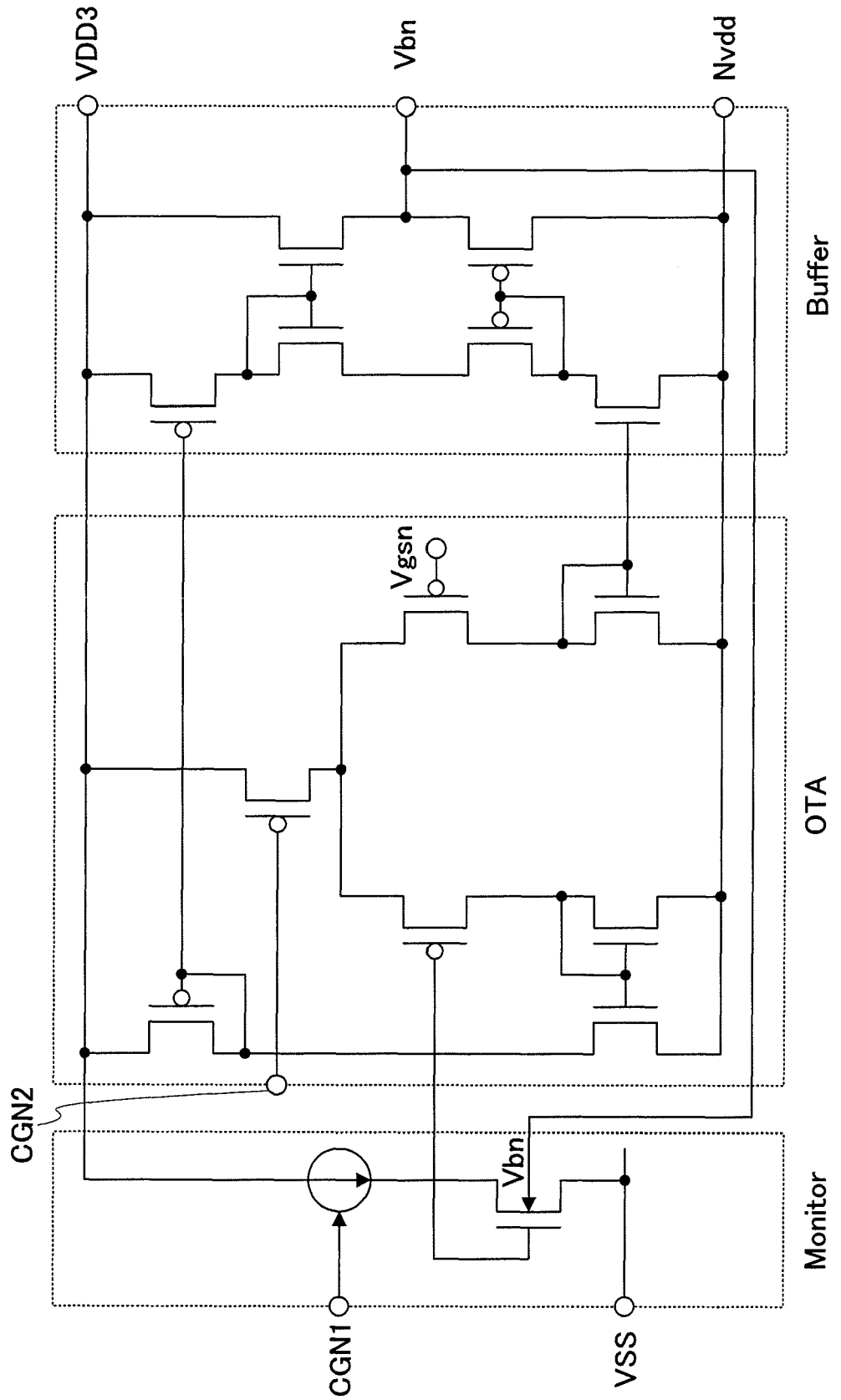
FIG. 15 is a view showing a configuration for a semiconductor integrated circuit apparatus controlling threshold voltage of an NchMOS transistor of the related art.

FIG. 11 is a view showing a configuration for a semiconductor integrated circuit apparatus of the ninth embodiment of the present invention. Portions with the same configuration as for FIG. 8 and FIG. 10 are given the same numerals and are not described.

In FIG. 11, semiconductor integrated circuit apparatus 900 is comprised of NchMOS transistor leakage current detection circuit 710, PchMOS transistor leakage current detection circuit 810, two substrate voltage control blocks 420, and internal circuit 130, and semiconductor integrated circuit apparatus 900 controls the threshold voltage of the NchMOS transistor and PchMOS transistor constituting internal circuit 130.

The same effects as with the seventh embodiment to the eighth embodiment can therefore also be obtained with a CMOS circuit.

The preferred embodiments of the present invention described above are merely given as example, and by no means limit the scope of the present invention.

Further, the title of "semiconductor integrated circuit apparatus" is used in the forms of the embodiments but this is merely for simplicity of description, and this may also be "semiconductor integrated circuit," or "substrate voltage control method," etc.

Moreover, the type, number, and method of connecting each circuit section constituting the semiconductor integrated circuit apparatus such as, for example, comparators etc. are by no means limited to the embodiments described above.

Each of the embodiments can be carried out for each of a plurality of circuit blocks the substrate may be electrically divided up into.

Further, implementation is possible not only for MOS transistors configured on a normal silicon substrate, but also for semiconductor integrated circuits configured using MOS transistors of an SOI (Silicon On Insulator) structure.

According to the present invention, with a leakage current detection circuit of semiconductor integrated circuit apparatus controlling threshold voltage of a transistor, it is possible to improve sensitivity and response of detection of a detection potential of a leakage current detection MIS transistor. Further, it is possible to cancel DC offset of a comparator by inserting a switch between a potential detection node of a leakage current detection MIS transistor and reference potential terminals and input terminals of a comparator.

Namely, (1) semiconductor integrated circuit apparatus of the present invention adopts a configuration having an internal circuit having a plurality of MIS transistors on a semiconductor substrate, a substrate voltage control block that supplies a substrate voltage to the internal circuit and controls threshold voltages for the MIS transistors of the internal circuit, a leakage current detection MIS transistor supplied with a supply voltage of an arbitrary potential to a drain, that has a source connected to a constant current source, and applied with an arbitrary stabilizing potential to a gate in such a manner that a substrate voltage is controlled by the substrate voltage control block, and a leakage current detection circuit constituted by a comparator comparing a source potential of the leakage current detection MIS transistor and a predetermined reference potential. The substrate voltage control block generates a substrate voltage based on comparison results of the comparator and applies the generated substrate voltage to the substrate of the leakage current detection MIS transistor and the substrate of the MIS transistors of the internal circuit.

(2) A semiconductor integrated circuit apparatus of the present invention also adopts a configuration having an internal circuit having a plurality of MIS transistors on a semiconductor substrate, a substrate voltage control block that supplies a substrate voltage to the internal circuit and controls threshold voltages for the MIS transistors of the internal circuit, a leakage current detection NchMIS transistor supplied with a high potential side supply voltage $V_{DD}$ to a drain, that has a source connected to a constant current source, and applied with an arbitrary stabilizing potential to a gate in such a manner that a substrate voltage is controlled by the substrate voltage control block, and a leakage current detection circuit constituted by a comparator comparing source potential of the leakage current detection NchMIS transistor and a predetermined reference potential. Here, the substrate voltage control block generates a substrate voltage based on comparison results of the comparator and applies the generated substrate voltage to the substrate of the leakage current detection NchMIS transistor and the substrate of the NchMIS transistors of the internal circuit.

(3) A semiconductor integrated circuit apparatus of the present invention further adopts a configuration having an internal circuit having a plurality of MIS transistors on a semiconductor substrate, a substrate voltage control block that supplies a substrate voltage to the internal circuit and controls threshold voltages for the MIS transistors of the internal circuit, a leakage current detection PchMIS transistor supplied with a low potential side supply voltage $V_{SS}$ to a drain, that has a source connected to a constant current source, and applied with an arbitrary stabilizing potential to a gate in such a manner that a substrate voltage is controlled by the substrate voltage control block, and a leakage current detection circuit constituted by a comparator comparing source potential of the leakage current detection PchMIS transistor and a predetermined reference potential. Here, the substrate voltage control block generates a substrate voltage based on comparison results of the comparator and applies the generated substrate voltage to the substrate of the leakage current detection PchMIS transistor and the substrate of the PchMIS transistors of the internal circuit, and sources of the plurality of PchMIS transistors of the internal circuit are connected to a high potential side supply voltage $V_{DD}$.

(4) Further, it is also possible to provide a switch arranged between first and second input terminals of the comparator and the source of the leakage current detection MIS transistor and a reference potential terminal, and an input data correction section that carries out substrate voltage adjustment two times by switching between the source of the leakage current detection MIS transistor and the reference potential terminal and each of the input terminals of the comparator using the switch and takes an average of respective reference voltage setting values when the internal circuit is not operating, and corrects DC of the comparator by generating a reference voltage based on the averaged substrate voltage setting value when the internal circuit is operating normally.

(5) A semiconductor integrated circuit apparatus of the present invention also adopts a configuration having an internal circuit having a plurality of MIS transistors on a semiconductor substrate, a substrate voltage control block that supplies a substrate voltage to the internal circuit and controls threshold voltages for the MIS transistors of the internal circuit, a leakage current detection NchMIS transistor with a low potential side supply voltage $V_{SS}$ supplied to a source and with a gate and drain connected together and connected to a constant current source, with the substrate voltage being controlled by the substrate voltage control block, and a leakage current detection circuit constituted by a comparator comparing drain potential of the leakage current detection NchMIS transistor and a predetermined reference potential. Here, the substrate voltage control block generates a substrate voltage based on comparison results of the comparator and applies the generated substrate voltage to the substrate of the leakage current detection NchMIS transistor and the substrate of the NchMIS transistors of the internal circuit, and comprises a switch arranged between first and second input terminals of the comparator and the drain of the leakage current detection NchMIS transistor and a reference potential terminal, and an input data correction section that carries out substrate voltage adjustment two times by switching between the drain of the leakage current detection NchMIS transistor and the reference potential terminal and each of the input terminals of the comparator using the switch and takes an average of respective reference voltage setting values when the internal circuit is not operating, and corrects DC offset of the comparator by generating a reference voltage based on the averaged substrate voltage setting value when the internal circuit is operating normally.

(6) A semiconductor integrated circuit apparatus of the present invention also adopts a configuration having an internal circuit having a plurality of MIS transistors on a semiconductor substrate, a substrate voltage control block that supplies a substrate voltage to the internal circuit and controls Threshold voltages for the MIS transistors of the internal circuit, a leakage current detection PchMIS transistor with high potential side supply voltage $V_{DD}$ supplied to a source and with a gate and drain connected together and connected to a constant current source, with the substrate voltage being controlled by the substrate voltage control block, and a leakage current detection circuit constituted by a comparator comparing drain potential of the leakage current detection PchMIS transistor and a predetermined reference potential. Here, the substrate voltage control block generates a substrate voltage based on comparison results of the comparator and applies the generated substrate voltage to the substrate of the leakage current detection PchMIS transistor and the substrate of the PchMIS transistors of the internal circuit. The substrate voltage control block comprises a switch arranged between first and second input terminals of the comparator and the drain of the leakage current detection PchMIS transistor and a reference potential terminal, and an input data correction section that carries out substrate voltage adjustment two times by switching between the drain of the leakage current detection PchMIS transistor and the reference potential terminal and each of the input terminals of the comparator using the switch and takes an average of respective reference voltage setting values when the internal circuit is not operating, and corrects DC offset of the comparator by generating a reference voltage based on the averaged substrate voltage setting value when the internal circuit is operating normally.

The semiconductor integrated circuit apparatus that controls transistor threshold voltage of the present invention is capable of raising detection sensitivity and response of a leakage current detection circuit and is capable of canceling DC offset of a comparator. This is extremely effective for controlling variation in threshold voltages of a semiconductor integrated circuit operating at a low supply voltage with a high degree of sensitivity, high response, and high degree of precision.

The present invention is not limited to the above described embodiments, and various variations and modifications may be possible without departing from the scope of the present invention.

This application is based on Japanese Patent Application No. 2005-217523 filed on Jul. 27, 2005, entire content of which is expressly incorporated by reference herein.

The invention claimed is:

1. A semiconductor integrated circuit apparatus, comprising:
   an internal circuit having a plurality of MIS transistors on a semiconductor substrate;
   a substrate voltage control block that supplies a substrate voltage to the internal circuit and controls threshold voltages for the MIS transistors of the internal circuit;
   a leakage current detection MIS transistor with an arbitrary potential supply voltage supplied to a source and with a gate and drain connected together and connected to a constant current source in such a manner that the substrate voltage is controlled by the substrate voltage control block; and
   a leakage current detection circuit having a comparator comparing a drain potential of the leakage current detection MIS transistor and a predetermined reference potential,
   wherein the substrate voltage control block generates a substrate voltage based on comparison results of the comparator and applies the generated substrate voltage to the substrate of the leakage current detection MIS transistor and the substrate of the MIS transistors of the internal circuit, and the substrate voltage control block comprises:
   a switch arranged between first and second input terminals of the comparator and the drain of the leakage current detection MIS transistor and a reference potential terminal; and
   an input data corrector that carries out substrate voltage adjustment two times by switching between the drain of the leakage current detection MIS transistor and the reference potential terminal and each of the input terminals of the comparator using the switch and takes an average of respective reference voltage setting values when the internal circuit is not operating, and corrects a DC offset of the comparator by generating a reference voltage based on the averaged substrate voltage setting value when the internal circuit is operating normally.

2. The semiconductor integrated circuit apparatus of claim 1, wherein the arbitrary potential supply voltage is a low potential side supply voltage VSS, the leakage current detection MIS transistor is a leakage current detection NchMIS transistor and the substrate of the MIS transistors of the internal circuit is the substrate of a NchMIS transistors of the internal circuit.

3. The semiconductor integrated circuit apparatus of claim 1, wherein the arbitrary potential supply voltage is a high potential side supply voltage VDD, the leakage current detection MIS transistor is a leakage current detection PchMIS transistor and the substrate of the MIS transistors of the internal circuit is the substrate of a PchMIS transistors of the internal circuit.

4. The semiconductor integrated circuit apparatus of claim 1, wherein the input data corrector:
   connects the drain of the leakage current detection MIS transistor to the first input terminal, connects the reference potential terminal to the second input terminal, adjusts the substrate voltage of the leakage current detection MIS transistor, and inputs the substrate voltage setting value to the first register, when the internal circuit is not operating;
   changes over the switch, connects the drain of the leakage current detection MIS transistor to the second input terminal, connects the reference potential terminal to the first input terminal, adjusts the substrate voltage of the leakage current detection MIS transistor, and inputs this substrate voltage setting value to a second register; and
   takes the average of the substrate voltage setting value stored in the first register and the substrate voltage setting value stored in the second register and stores the averaged substrate voltage setting value in a third register, and at the time of normal operation of the internal circuit, generates a substrate voltage based on the substrate voltage setting value stored in the third register, and corrects a DC offset of the comparator.

5. The semiconductor integrated circuit apparatus of claim 1, wherein
   the internal circuit has a CMOS circuit; and
   the substrate voltage control block controls the threshold voltages for the NchMOS transistors and PchMOS transistors of the CMOS circuit.

* * * * *